US 7,020,951 B2

(12) United States Patent
Lin et al.

(10) Patent No.: US 7,020,951 B2
(45) Date of Patent: Apr. 4, 2006

(54) METHOD OF MAKING A MERGED MAGNETIC READ HEAD AND WRITE HEAD

(75) Inventors: Tsann Lin, Saratoga, CA (US); Daniele Mauri, San Jose, CA (US)

(73) Assignee: International Business Machines, Armonk, NY (US)

( * ) Notice: Subject to any disclaimer, the term of this patent is extended or adjusted under 35 U.S.C. 154(b) by 82 days.

(21) Appl. No.: 10/704,455

(22) Filed: Nov. 7, 2003

(65) Prior Publication Data

US 2004/0095691 A1   May 20, 2004

Related U.S. Application Data

(62) Division of application No. 09/721,851, filed on Nov. 24, 2000, now Pat. No. 6,910,259, which is a division of application No. 09/138,306, filed on Aug. 21, 1998, now Pat. No. 6,185,078.

(51) Int. Cl.
  *G11B 5/127*   (2006.01)
  *H04R 31/00*   (2006.01)

(52) U.S. Cl. ............... 29/603.14; 29/603.07; 29/603.13; 29/603.15; 29/603.27; 360/324; 360/325; 360/326; 360/327; 427/127; 427/128

(58) Field of Classification Search ............ 29/603.07, 29/603.13, 603.15, 603.27; 360/324, 325, 360/326, 327; 427/127, 128
See application file for complete search history.

(56) References Cited

U.S. PATENT DOCUMENTS 5,491,600 A * 2/1996 Chen ..................... 360/113

5,668,685 A * 9/1997 Soeya et al. ............. 360/113
5,668,688 A * 9/1997 Dykes ..................... 360/113
5,768,071 A * 6/1998 Lin ......................... 360/113
5,828,531 A * 10/1998 Gill ......................... 360/113

(Continued)

FOREIGN PATENT DOCUMENTS

JP        04208848 A * 7/1992

OTHER PUBLICATIONS

"Track-edge read-write effect of inductive/MR dual element heads"; Yuan, S.W.; Thayamballi, P.; Hua-Ching Tong; Magnetics, IEEE Transactions on vol. 32, Issue 5, Sep. 1996; Page(s):3461-3463.*

*Primary Examiner*—A. Dexter Tugbang
*Assistant Examiner*—Paul D. Kim
(74) *Attorney, Agent, or Firm*—Ervin F. Johnston

(57) ABSTRACT

An antiferromagnetic stabilization scheme is employed in a magnetic head for magnetically stabilizing a free layer of a spin valve. This is accomplished by utilizing an antiferromagnetic oxide film below a spin valve sensor in a read region and first and second lead layers in end regions and a ferromagnetic film in each of the lead layers that exchange couples to the antiferromagnetic oxide film in the end regions. The ferromagnetic films are pinned with their magnetic moments oriented parallel to an air bearing surface (ABS) of the magnetic head. The ferromagnetic film magnetostatically couples to the free layer which causes the free layer to be in a single magnetic domain state. Accordingly, when the free layer is subjected to magnetic incursions from a rotating disk in a disk drive, the free layer maintains a stable magnetic condition so that resistance changes of the free layer are not altered by differing magnetic conditions of the free layer.

15 Claims, 14 Drawing Sheets

(AFM STABILIZATION)

U.S. PATENT DOCUMENTS

| | | | | |
|---|---|---|---|---|
| 5,872,689 A | * | 2/1999 | Gill | 360/113 |
| 5,883,764 A | * | 3/1999 | Pinarbasi | 360/113 |
| 5,920,446 A | * | 7/1999 | Gill | 360/324 |
| 5,974,657 A | * | 11/1999 | Fox et al. | 29/603.08 |
| 5,995,338 A | * | 11/1999 | Watanabe et al. | 360/113 |
| 6,028,730 A | * | 2/2000 | Ishihara | 360/113 X |
| 6,118,622 A | * | 9/2000 | Gill | 360/113 |
| 6,249,406 B1 | * | 6/2001 | Gill et al. | 360/324.11 |
| 6,460,243 B1 | * | 10/2002 | Pinarbasi | 29/603.14 |
| 6,469,873 B1 | * | 5/2003 | Malamas et al. | 360/314 |

* cited by examiner

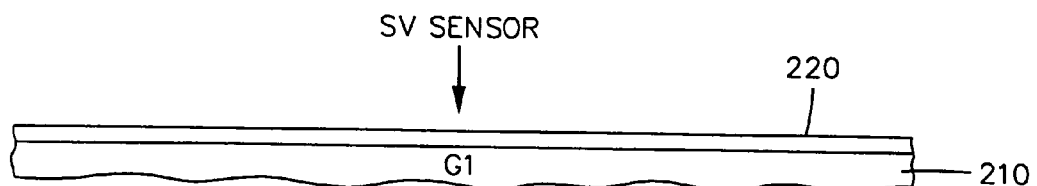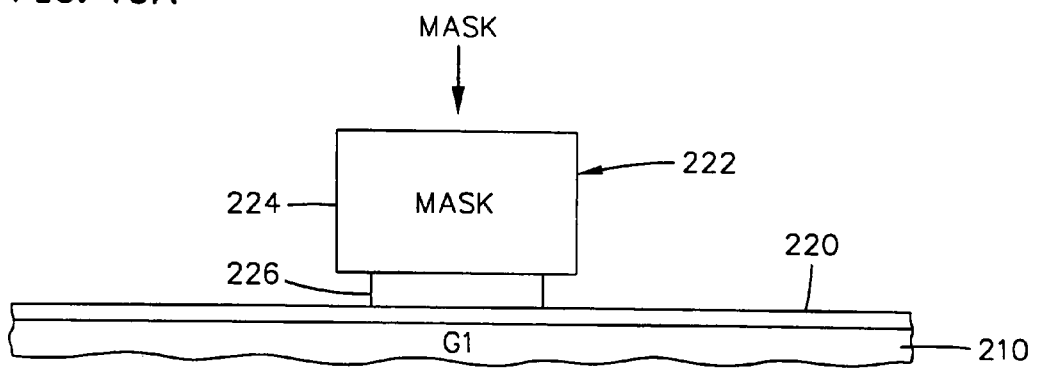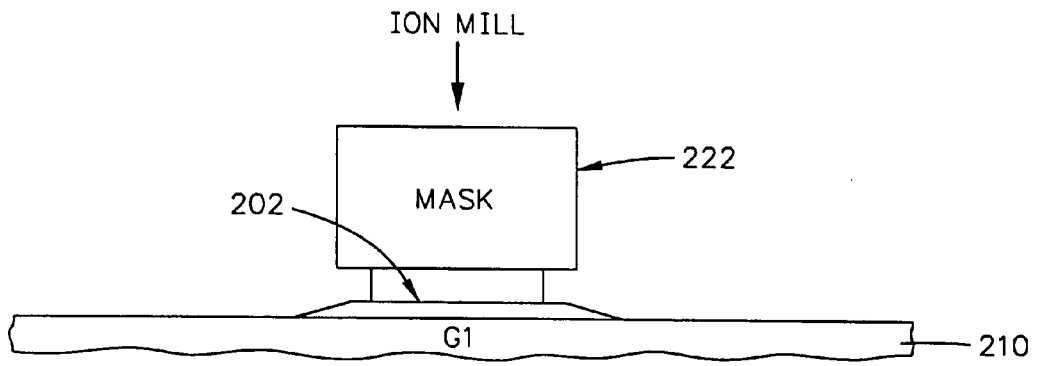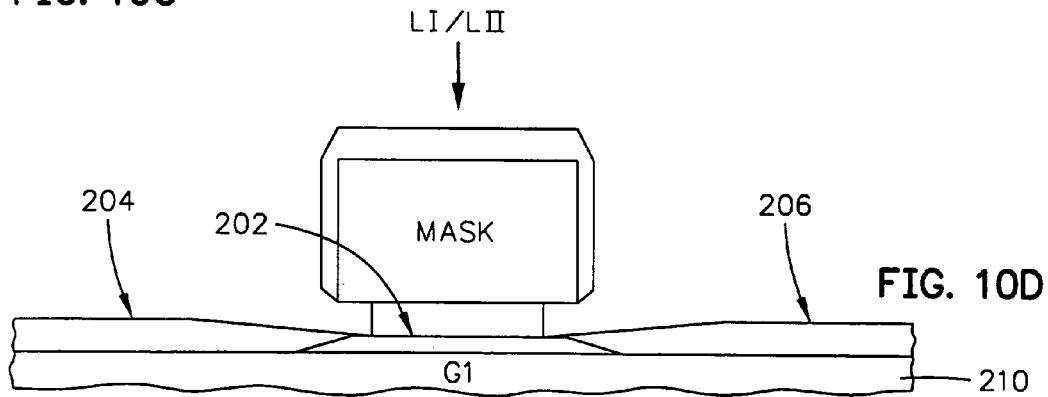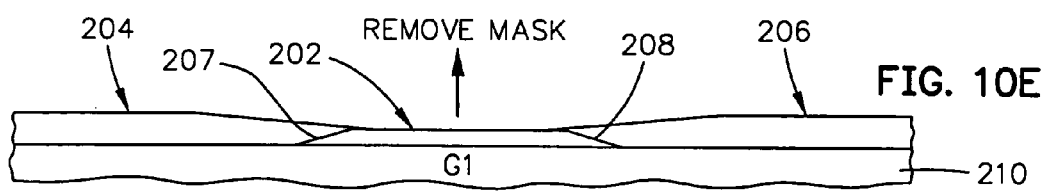

(HM STABILIZATION)

(AFM STABILIZATION)

(AFM STABILIZATION)

(AFM STABILIZATION)

METHOD OF MAKING A MERGED MAGNETIC READ HEAD AND WRITE HEAD

REFERENCE TO RELATED APPLICATION

This is a divisional of application Ser. No. 09/721,851 filed Nov. 24, 2000 now U.S. Pat. No. 6,910,259 which is a divisional of application Ser. No. 09/138,306 filed Aug. 21, 1998 which is now U.S. Pat. No. 6,185,078.

BACKGROUND OF THE INVENTION

1. Field of the Invention

The present invention relates to a spin valve read head with an antiferromagnetic oxide film as a longitudinal bias layer and a portion of the first read gap layer, and more particularly to a spin valve read head wherein a ferromagnetic free layer of a spin valve sensor is longitudinally biased by an antiferromagnetic oxide film that is located between an insulation gap layer and the spin valve sensor so as to form a portion of the first read gap.

2. Description of Related Art

The heart of a computer is an assembly that is referred to as a magnetic disk drive. The magnetic disk drive includes a rotating magnetic disk, write and read heads. The read and write heads are directly fabricated on a slider that has an air bearing surface (ABS). The slider is suspended by a suspension arm above the rotating disk and an actuator that swings the suspension arm to locate the read and write heads over selected circular tracks on the rotating disk. The suspension arm biases the slider into contact with the surface of the disk when the disk is not rotating but, when the disk rotates, air is swirled by the rotating disk adjacent the ABS causing the slider to ride on an air bearing a slight distance from the surface of the rotating disk. The write and read heads are employed for writing magnetic impressions to and reading magnetic impressions from the rotating disk. The read and write heads are connected to processing circuitry that operates according to a computer program for implementing the writing and reading functions.

The write head includes a coil layer embedded in first, second and third insulation layers (insulation stack), the insulation stack being sandwiched between first and second pole piece layers. A magnetic gap is formed between the first and second pole piece layers by a write gap layer at an air bearing surface (ABS) of the write head. The pole piece layers are connected at a back gap. Current conducted to the coil layer induces a magnetic field across the gap between the pole pieces. This field fringes across the gap at the ABS for the purpose of writing information in tracks on moving media, such as in circular tracks on a rotating disk.

The read head includes first and second shield layers, first and second gap layers, a read sensor and first and second lead layers that are connected to the read sensor for conducting a sense current through the read sensor. The first and second gap layers are located between the first and second shield layers and the read sensor and the first and second lead layers are located between the first and second gap layers. The distance between the first and second shield layers determines the linear read density of the read head. Accordingly, the first and second gap layers are constructed as thin as possible without shorting the first and second shield layers to the read sensor and the first and second lead layers. The read sensor has first and second side edges that define a track width of the read head. The narrower the track width the higher the track density in terms of tracks per inch read by the read head. The product of the linear density and the track density equals the areal density of the read head which is the bit reading capability of the read head per square inch of the magnetic media.

The first and second lead layers abut the first and second side edges of the read sensor in a connection which is referred to in the art as a contiguous junction. Each of the read sensor and the lead layers comprises a plurality of films. A spin valve read sensor typically comprises a spacer layer sandwiched between a free layer and a pinned layer. Adjacent the pinned layer is a pinning layer for pinning a magnetic moment of the pinned layer. The free layer has a magnetic moment that is free to rotate relative to the fixed magnetic moment of the pinned layer in response to field incursions from the rotating magnetic disk which causes a change in resistance of the read sensor to the sense current that can be detected as potential changes by processing circuitry. Each lead layer typically comprises one or more films that longitudinally bias the free layer of the read sensor, and an electrically conductive film sandwiched between an adhesion layer and a cap layer.

The free layer is a soft ferromagnetic material, such as Permalloy (Ni—Fe), that is deposited in the presence of a magnetic field that orients the magnetic spins of the free layer substantially parallel to the ABS. Accordingly, the magnetic moment of the free layer is set along what is referred to in the art as an easy axis. Magnetic incursions from the rotating magnetic disk rotate the magnetic moment of the free layer from the easy axis. Typically, magnetic spins of the free layer are unstable when subjected to a magnetic field. These magnetic spins are in domains that interface with each other along domain walls. When the free layer is subjected to and then released from the magnetic field, the domain walls do not return to their original orientation. This changes the magnetics of the free layer and affects its performance. Accordingly, the free layer must be stabilized by longitudinal biasing so that the magnetic spins of the free layer are directed parallel to the ABS in a single domain state.

There are two stabilization schemes for longitudinally biasing the free layer. One stabilization scheme is to provide each of the lead layers with a non-magnetic seed layer and a hard magnetic film that magnetostatically interacts with the free layer along its easy axis. The other stabilization scheme is to provide each of the lead layers with a soft ferromagnetic film and an antiferromagnetic metallic film that exchange couple to each other, resulting in magnetostatic and exchange interactions with the free layer along the easy axis. Each stabilization scheme has its advantages and disadvantages. A read sensor with the antiferromagnetic stabilization scheme has a better read sensitivity than that with the hard magnetic stabilization scheme. However, the antiferromagnetic film is typically thicker than the hard magnetic film which causes a greater step between the read sensor and each of the first and second lead layers. This greater step requires that the second read gap layer be thicker in order to ensure that there are no pinholes between the lead layers and the second shield layer that can cause a short in the sense current circuit. A thicker second read gap layer equates to less linear read density of the read head. Accordingly, there is a strong need to provide a read head that has a high read sensitivity similar to a read head with an antiferromagnetic stabilization scheme and yet has a small step similar to a read head with a hard magnetic film stabilization scheme.

SUMMARY OF THE INVENTION

The present invention provides a read head with an antiferromagnetic stabilization scheme that has a small step between the read sensor layer and the lead layers. Accordingly, the read head has high read sensitivity and a thinner second gap layer so as to increase linear read density. This is accomplished by removing the antiferromagnetic metallic films from the first and second lead layers and locating an antiferromagnetic oxide film below the read sensor in a read region and below the first and second leads in first and second end regions. Each lead layer has a ferromagnetic film that contacts the antiferromagnetic oxide film and exchange couples thereto and that abuts a respective side edge of the read sensor for sensor stabilization. The exchange coupling orients the spins of each ferromagnetic film parallel to the ABS resulting in magnetostatic and exchange interactions with the free layer of the read sensor. The read sensor has a non-magnetic seed layer sandwiched between the free layer and the antiferromagnetic oxide film so that the free layer does not exchange couple to the antiferromagnetic oxide film.

Merged magnetic heads are typically made in rows and columns of heads on a wafer. In a method of making the read head portion of the merged magnetic head the antiferromagnetic oxide film is deposited on top of the first gap layer over the entire wafer. Spin valve sensor material is then deposited on top of the antiferromagnetic oxide film over the entire wafer. The first deposited film of the spin valve sensor is the aforementioned non-magnetic seed layer. A mask is then formed with first and second openings where the first and second lead layers are to be formed. Milling is then employed to remove spin valve sensor material to expose the antiferromagnetic oxide film in the first and second openings. The first and second lead layers are then deposited on the antiferromagnetic oxide film in the first and second openings. The first deposited film of each lead layer is the aforementioned ferromagnetic film.

The free layer of the spin valve sensor may be deposited in the presence of a magnetic field that is directed parallel to the ABS so as to set the easy axis of the free film parallel to the ABS. An antiferromagnetic Ir—Mn film of the spin valve sensor may be deposited in the presence of a magnetic field that is directed perpendicular to the ABS so as to cause the antiferromagnetic metallic film to orient the magnetic spins of the pinned layer perpendicular to the ABS. In another embodiment of the method an antiferromagnetic Ni—Mn film is annealed for 2–10 hours at 240 °–280° C. in a magnetic field directed perpendicular to the ABS. After completion of the spin valve sensor and the lead layers a portion of the antiferromagnetic Ni—Mn film is milled away so as to increase the linear read density of the read head. This milling also removes a portion of the lead layers so as to not increase a step between the spin valve sensor, and each lead layer.

An object of the present invention is to provide a spin valve read head that has high read sensitivity similar to a read head with an antiferromagnetic stabilization scheme in the art and a step similar to a read head with a hard magnet stabilization scheme in the art.

Another object is to provide a stabilization scheme for a free layer of a spin valve sensor wherein the first gap between a first shield layer and the free layer is increased.

A further object is to provide a method of making a spin valve read head that has high sensitivity and a small step.

Still another object is to provide the previous method along with a method of reducing the thickness of the antiferromagnetic metallic film by ion milling.

Other objects and advantages will become apparent upon reading the following detailed description of the invention taken together with the accompanying drawings.

BRIEF DESCRIPTION OF THE DRAWINGS

FIGS. 10A–10E are schematic illustrations of various steps in the construction of the read head shown in FIG. 9;

DESCRIPTION OF THE PREFERRED EMBODIMENTS

Magnetic Disk Drive

Figure 1:
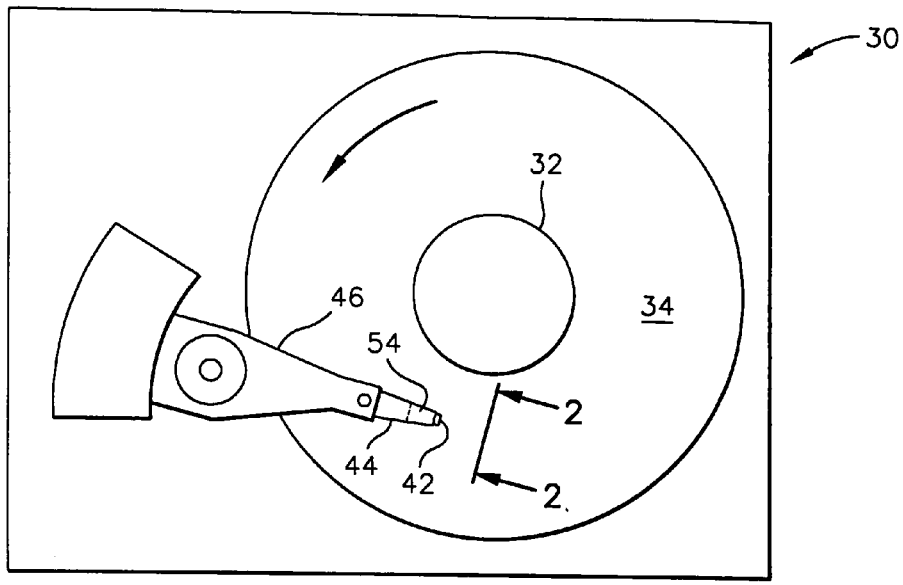
FIG. 1 is a plan view of an exemplary magnetic disk drive.
Figure 2:
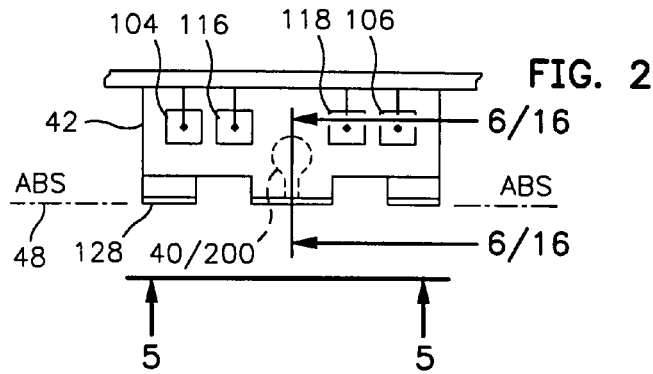
FIG. 2 is an end view of a slider with a magnetic head of the disk drive as seen in plane 2—2.
Figure 3:
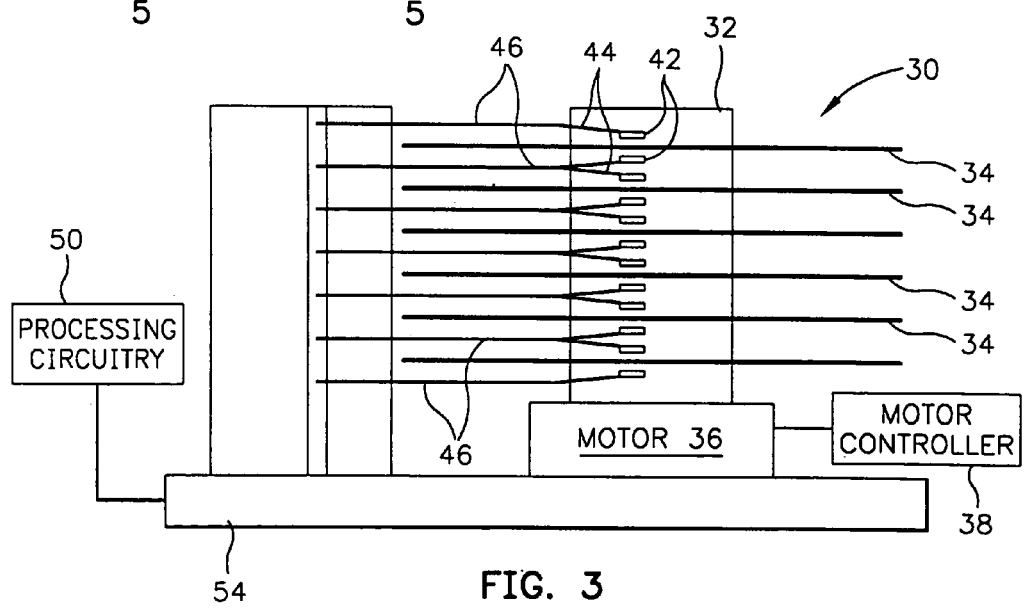
FIG. 3 is an elevation view of the magnetic disk drive wherein multiple disks and magnetic heads are employed.
Figure 4:
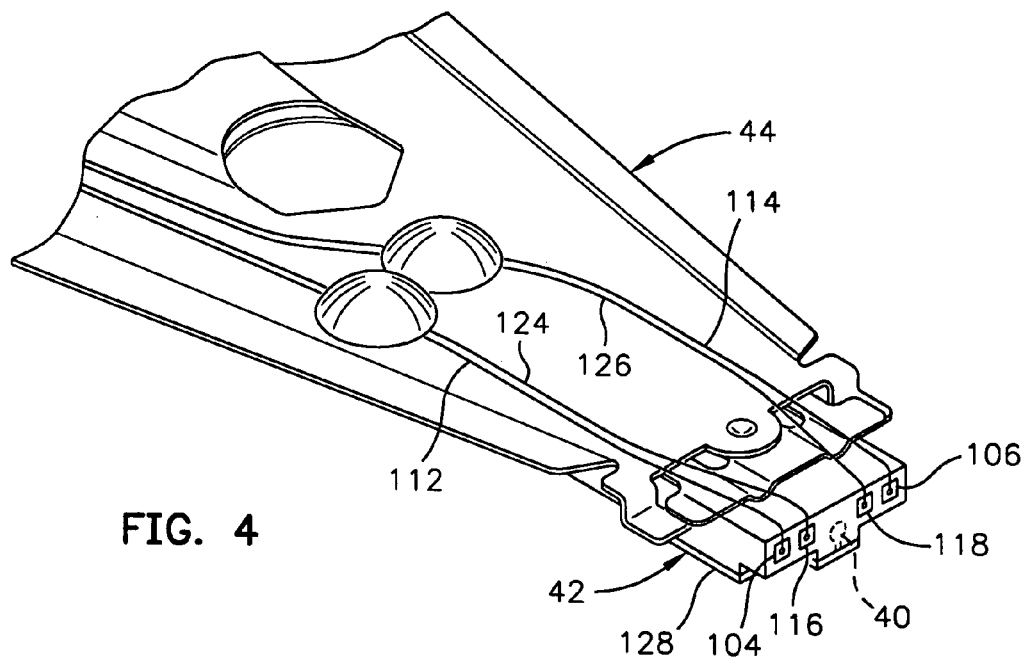
FIG. 4 is an isometric illustration of an exemplary suspension system for supporting the slider and magnetic head.

Referring now to the drawings wherein like reference numerals designate like or similar parts throughout the several views there is illustrated in FIGS. 1–3 a magnetic disk drive 30. The drive 30 includes a spindle 32 that supports and rotates a magnetic disk 34. The spindle 32 is rotated by a motor 36 that is controlled by a motor controller 38. A merged magnetic read and write head 40 is fabricated on a slider 42 that is supported by a suspension 44 and actuator arm 46. A plurality of disks, sliders and suspensions may be employed in a large capacity direct access storage device (DASD) as shown in FIG. 3. The suspension 44 and actuator arm 46 position the slider 42 so that the magnetic head 40 is in a transducing relationship with a surface of the magnetic disk 34. When the disk 34 is rotated by the motor 36 the slider is supported on a thin (typically 0.05 µm) cushion of air (air bearing) between the surface of the disk 34 and the air bearing surface (ABS) 48. The magnetic head 40 may then be employed for writing information to multiple circular tracks on the surface of the disk 34, as well as for reading information therefrom. Processing circuitry 50 exchanges signals, representing such information, with the head 40, provides motor drive signals for rotating the magnetic disk 34, and provides control signals for moving the slider to various tracks. In FIG. 4 the slider 42 is shown mounted on the suspension 44. The components described hereinabove may be mounted on a frame 54, as shown in FIG. 3.

Figure 5:
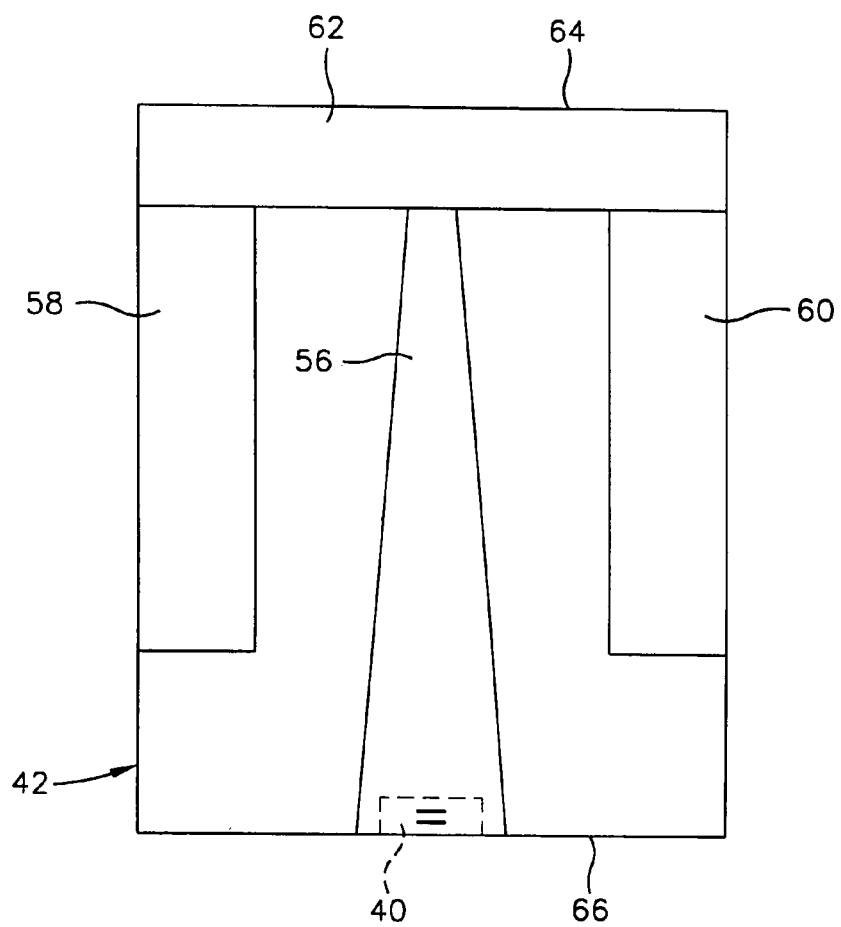
FIG. 5 is an ABS view of the magnetic head taken along plane 5—5 of FIG. 2.

FIG. 5 is an ABS view of the slider 42 and the magnetic head 40. The slider has a center rail 56 that supports the magnetic head 40, and side rails 58 and 60. The rails 56, 58 and 60 extend from a cross rail 62. With respect to rotation of the magnetic disk 34, the cross rail 62 is at a leading edge 64 of the slider and the magnetic head 40 is at a trailing edge 66 of the slider.

Merged Magnetic Head

Figure 6:
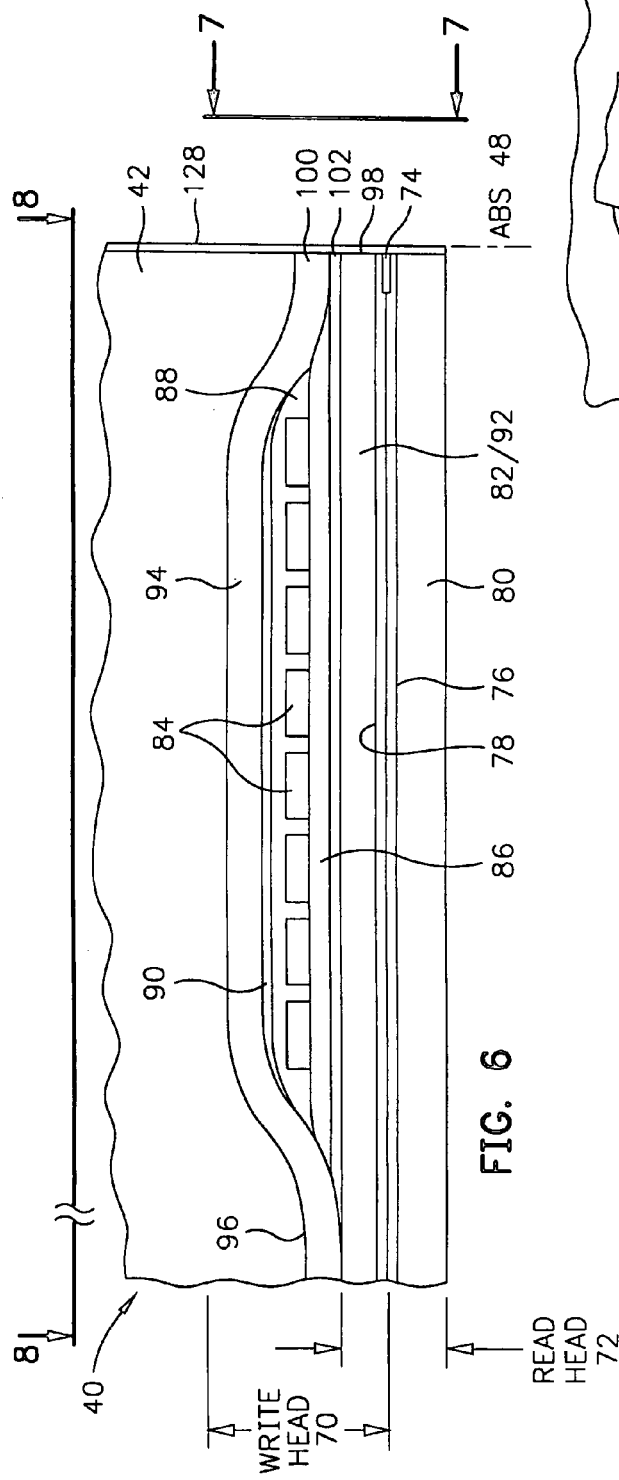
FIG. 6 is a partial view of the slider and a magnetic head as seen in plane 6—6 of FIG. 2.
Figure 7:
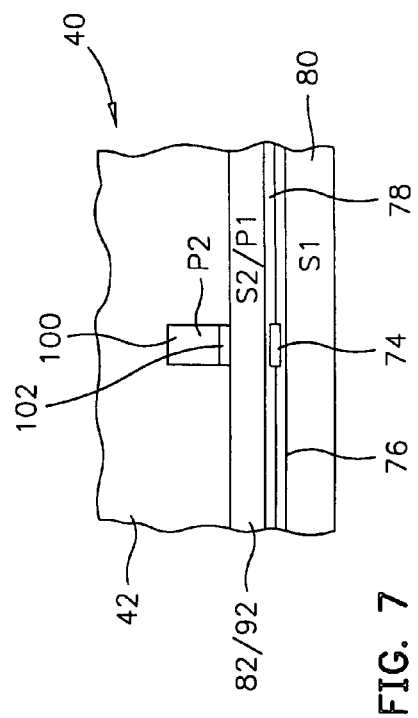
FIG. 7 is a partial ABS view of the slider taken along plane 7—7 of FIG. 6 to show the read and write head portions of the magnetic head.

FIG. 6 is a side cross-sectional elevation view of the merged spin valve head 40 which has a write head portion 70 and a read head portion 72, the read head portion employing a spin valve sensor 74. FIG. 7 is an ABS view of FIG. 6. The spin valve sensor 74 is located between first and second gap layers 76 and 78 and the gap layers are located between first and second shield layers 80 and 82. In response to external magnetic fields, the resistance of the spin valve sensor 74 changes. A sense current $I_s$ conducted through the spin valve sensor causes these resistance changes to be manifested as potential changes. These potential changes are then processed as readback signals by the processing circuitry 50 shown in FIG. 3.

Figure 8:
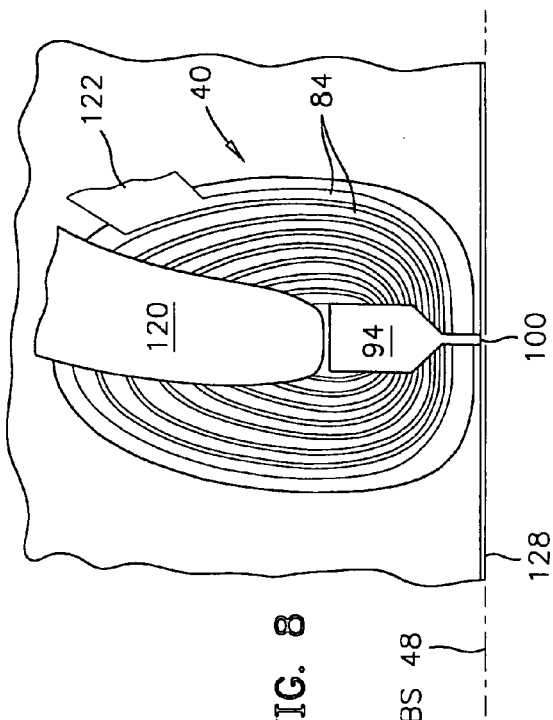
FIG. 8 is a view taken along plane 8—8 of FIG. 6.

The write head portion of the merged head includes a coil layer 84 located between first and second insulation layers 86 and 88. A third insulation layer 90 may be employed for planarizing the head to eliminate ripples in the second insulation layer caused by the coil layer 84. The first, second and third insulation layers are referred to in the art as an "insulation stack". The coil layer 84 and the first, second and third insulation layers 86, 88 and 90 are located between first and second pole piece layers 92 and 94. The first and second pole piece layers 92 and 94 are magnetically coupled at a back gap 96 and have first and second pole tips 98 and 100 which are separated by a write gap layer 102 at the ABS. As shown in FIGS. 2 and 4, first and second solder connections 104 and 116 connect leads from the sensor 74 to leads 112 and 124 on the suspension 44. Third and fourth solder connections 118 and 106 connect leads 120 and 122 from the coil 84 (see FIG. 8) to leads 126 and 114 on the suspension 44. A overcoat layer 128 may be employed for protecting the sensitive elements of the magnetic head, as shown in FIGS. 2, 4, 6 and 7. It should be noted that the merged head 50 employs a single layer 82/92 to serve a double function as a second shield layer for the read head and as a first pole piece for the write head. A piggyback head employs two separate layers for these functions.

Figure 9:
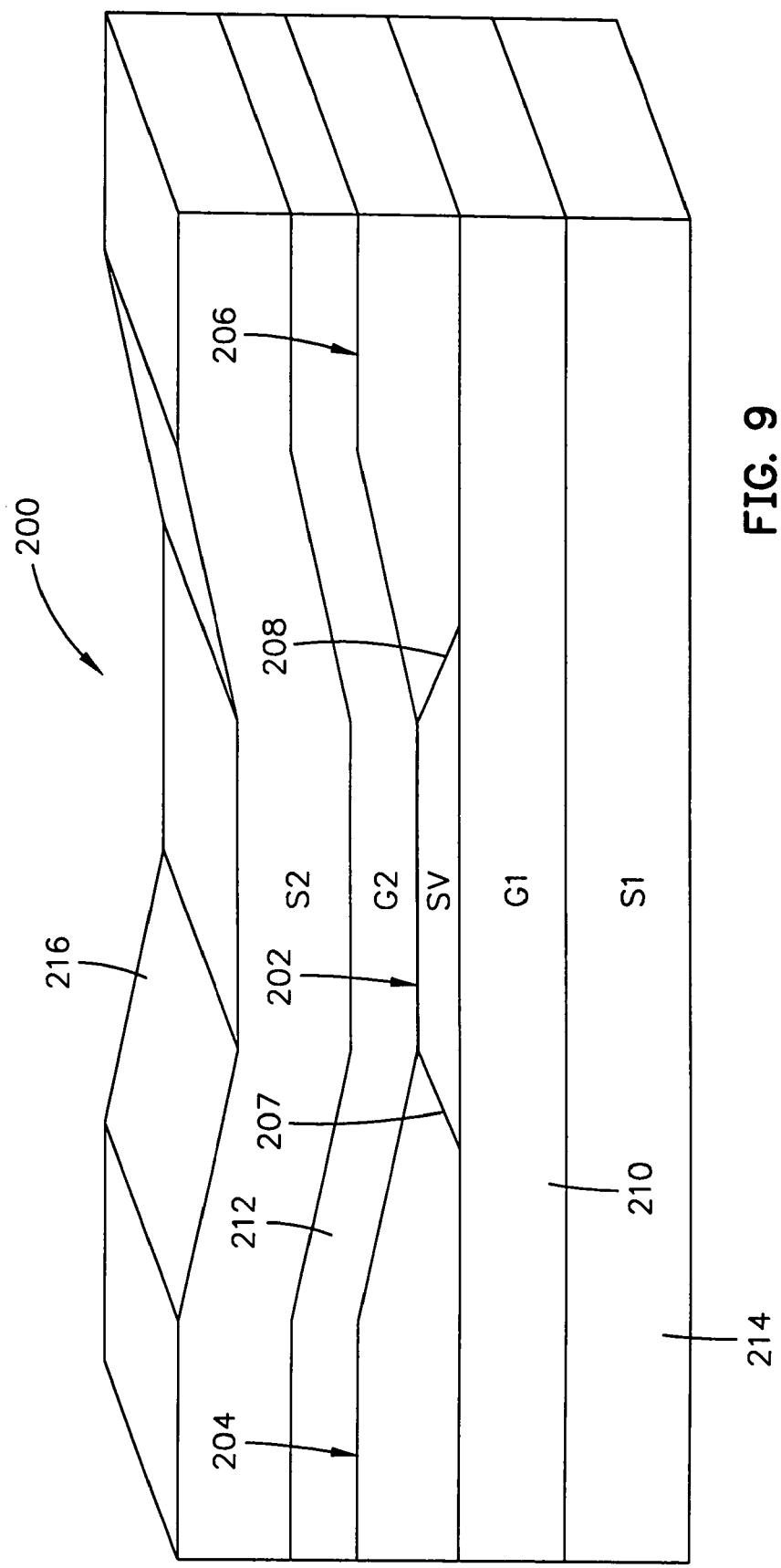
FIG. 9 is an ABS illustration of an exemplary spin valve read head, in the art.

FIG. 9 is an ABS illustration of an exemplary spin valve read head 200 which has a spin valve sensor 202 and first and second lead layers 204 and 206. The first and second lead layers 204 and 206 are connected to first and second side edges 207 and 208 of the spin valve sensor 202 which define a track width of the read head. The track width determines the track density of the read head in terms of tracks per inch (TPI). It should be noted that the first and second side edges 207 and 208 have a slope which is caused during the construction of the spin valve sensor. Each of the first and second lead layers 204 and 206 is a plurality of layers which are vacuum deposited through an opening in a bi-layer photoresist mask (not shown). The shadowing of the mask causes the sloping side edges 207 and 208 which will become more fully understood in the explanation of the construction of the read sensor and the first and second lead layers in FIGS. 10A–10E. The direct engagement of the side edges of the first and second lead layers 204 and 206 to the side edges 207 and 208 of the read sensor is referred to in the art as contiguous junctions.

The spin valve sensor 202 and the first and second lead layers 204 and 206 are sandwiched between first and second read gap layers 210 and 212. The material employed for the first and second gap layers 210 and 212 is typically aluminum oxide ($Al_2O_3$). The first and second read gap layers 210 and 212 are, in turn, sandwiched between first and second ferromagnetic shield layers 214 and 216. The shield layers protect the spin valve sensor 202 from stray magnetic fields. The distance between the first and second shield layers 214 and 216 determines the read gap of the read head which, in turn, determines the linear read density of the read head. The product of the linear density and the track density of the read head determines its overall read density capability in terms of bits per inch of the magnetic medium (BPI). Each of the spin valve sensor 202 and the first and second lead layers 204 and 206 comprise a plurality of films which will be described in more detail hereinafter.

FIGS. 10A–10E illustrate various steps in an exemplary method of construction of the spin valve sensor 202 and the first and second lead layers 204 and 206 of the read head 200 in FIG. 9. In FIG. 10A a spin valve sensor material layer 220 has been deposited on a first gap layer 210 in a magnetron— or an ion-beam sputter system. This deposition is on a wafer where rows and columns of magnetic heads are constructed and later cut so as to form individual heads. In FIG. 10B a bi-layer photoresist layer 222 has been formed on the spin valve sensor material layer 220. The photoresist layer 222 comprises top and bottom photoresist layers 224 and 226 which are of different photoresist materials that are preferential dissolved by a solvent. After spinning the bottom and top photoresist layers 226 and 224 on the wafer, they are photopatterned by light exposure in the areas which are to be removed by a developer. The developer removes the exposed photoresist and then a solvent is employed which preferentially dissolves the bottom photoresist layer 226 to provide the undercut under the top photoresist layer 224. In FIG. 10C ion milling is employed for removing the spin valve sensor material exposed by the photoresist mask 222. While the photoresist mask 222 is still in place the various films of the first and second lead layers 204 and 206, are deposited as shown in FIG. 10D. The photoresist mask 222 is then removed in FIG. 10E leaving the first and second lead layers 204 and 206 making contiguous junctions with the side edges 207 and 208 of the spin valve sensor 202.

Figure 11:
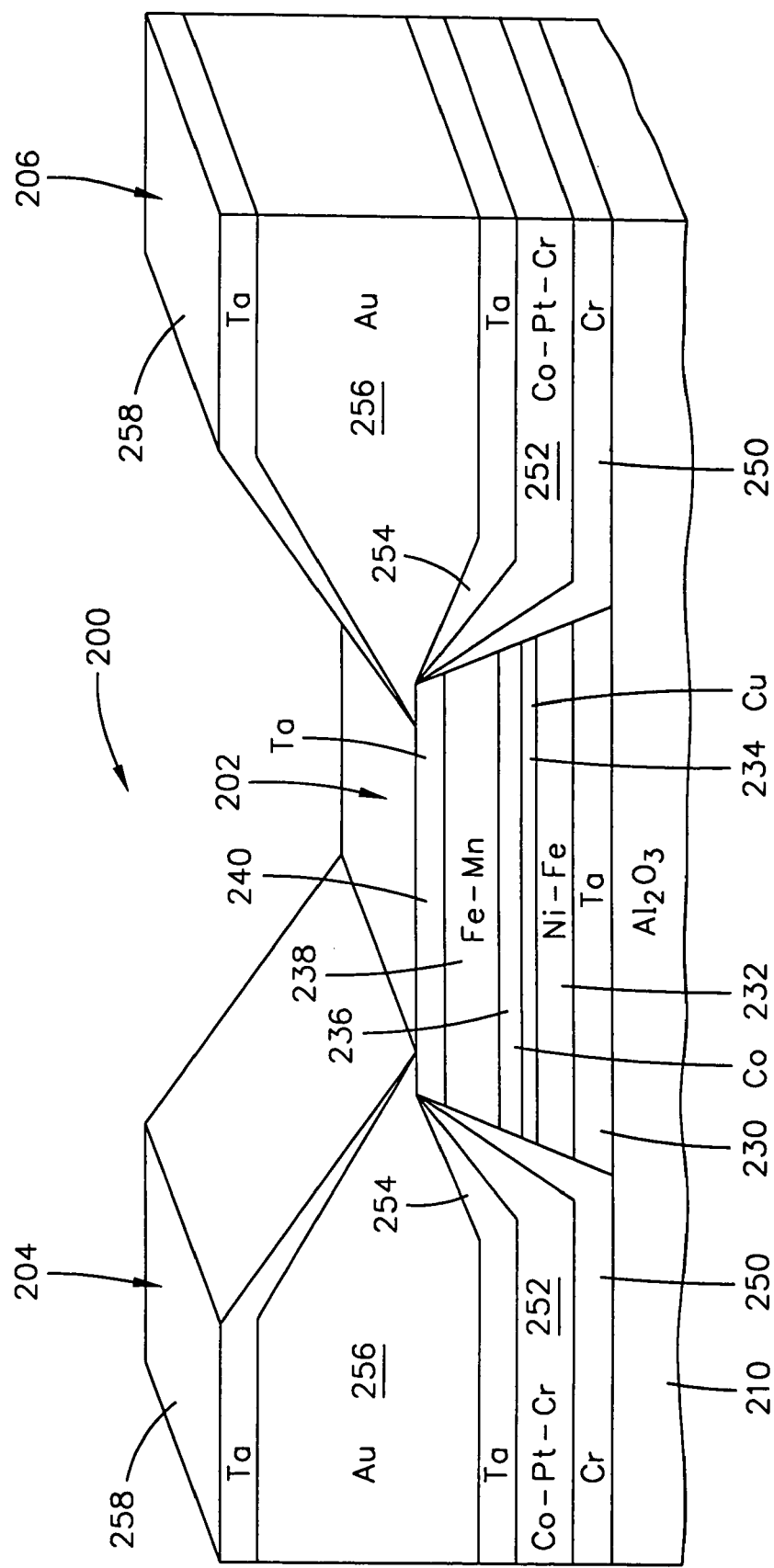
FIG. 11 is an enlarged ABS illustration of the read sensor and first and second lead layers of the read head with a hard-magnetic stabilization schemes shown in FIG. 9.

FIG. 11 is an enlarged ABS illustration of the spin valve sensor 202 and the first and second lead layers 204 and 206 of the read head shown in FIG. 9. The spin valve read sensor comprises non-magnetic seed layer 230, a ferromagnetic free layer 232, a non-magnetic electrically conductive spacer layer 234, a ferromagnetic pinned layer 236, an antiferromagnetic pinning layer 238 and a cap layer 240. The layer 232 is referred to as a free layer because its magnetic moment is free to rotate in response to magnetic incursions from a rotating disk. The layer 236 is referred to as a pinned layer because its magnetic moment is pinned in a fixed position perpendicular to the ABS. The layer 238 is referred to as a pinning layer because it pins the magnetic moment of the layer 236 in the desired direction perpendicular to the ABS. The spacer layer 234 is sandwiched between the free layer 232 and the pinned layer 236. The direction of the magnetic moment of the free layer 232 is typically parallel to the ABS. When the free layer is subjected to positive and negative magnetic incursions from the rotating disk the magnetic moment of the free layer rotates upwardly or downwardly, which rotation is relative to the fixed position of the magnetic moment of the pinned layer 236. These relative rotations increase or decrease the resistance of the spin valve sensor 202 which can be detected as potential changes in processing circuitry when a sense current is conducted through the spin valve sensor by the first and second lead layers 204 and 206. The operation of these resistance changes depends upon the thickness of the spacer layer 234. The thickness of the spacer layer 234 is chosen so as to be less than the mean conduction path of the electrons through the sensor 202 so that there is an increase or a decrease in the scattering of these electrons, depending upon the relative rotations of the magnetic moments of the free and pinned layers 234 and 236. This electron scattering equates to the desired resistance changes.

Various magnetic fields are balanced in order to establish the orientation of the magnetic moment of the free layer 232 parallel to the ABS. Because of the thinness of the spacer layer 234 there is a ferromagnetic coupling between the pinned layer 236 and the free layer 232 which is directed perpendicular to the ABS. Because of the pinned magnetic moment of the pinned layer 236 there is a stray demagnetizing field from the pinned layer 236 to the free layer 232 which is also directed perpendicular to the ABS. When the sense current is conducted through the spin valve sensor 202 the layers 230, 234, 236, 238 and 240 apply a sense current field to the free layer 232 which is also directed perpendicular to the ABS. The direction of the sense current can direct the field either toward or away from the ABS. By proper balancing of these fields the orientation of the magnetic moment of the free layer 232 is substantially parallel to the ABS. Typical materials and thicknesses in nanometers (nm), shown in parenthesis, for the layers 230, 232, 234, 236, 238 and 240 are as follows: Ta(5)/Ni—Fe(5.6)/Cu (22.6)/Co(2.8)/Fe—Mn(10)/Ta(5).

FIG. 11 shows an embodiment 200 of a spin valve sensor 202 and a first and second lead layers 204 and 206. The spin valve read sensor 202 comprises a non-magnetic seed layer 230 of Ta(5), a ferromagnetic free layer 232 of Ni—Fe (5.6), a non-magnetic electrically conductive spacer layer 234 of Cu(2.6), a ferromagnetic pinned layer 236 of Co(2.8), an antiferromagnetic pinning layer 238 of Fe—Mn(10) and a cap layer 240 of Ta(5). Each of the lead layers 204 and 206 comprises a layer 250, a hard magnetic layer 252, a non-magnetic seed layer 254, an electrically conductive layer 256 and a cap layer 258. The non-magnetic seed layer 250 may be chromium Cr(5), the hard magnetic layer 252 may be cobalt-platinum-chromium Co—Pt—Cr(9), the non-magnetic adhesion conductive layer 254 may be tantalum Ta, the electrically conductive layer 256 may be gold Au(40) and the cap layer 258 may be tantalum Ta(5). Cr/Co—Pt—Cr films exhibit a high coercivity ($H_C$) needed for longitudinally biasing the free layer 232. The Cr film 250 is employed for preventing magnetic softening caused by exchange coupling between the Ni—Fe and Co—Pt—Cr films while still maintaining magnetostatic and exchange interactions between these two films. The Cr film 250 also orients the magnetic moment Co—Pt—Cr film in the plane parallel to the interface and thus improves in-plane coercivity ($H_C$). The magnetic moment of the Co—Pt—Cr film is typically about 1.8 times that of the free layer 232 so that the stability of the spin valve sensor 202 is ensured while maintaining high read sensitivity. An increase in the magnetic moment of the Co—Pt—Cr film will improve the sensor stability but will decrease the signal sensitivity. The stabilization scheme shown in the embodiment 200 in FIG. 11 is referred to hereinafter as the hard magnet (HM) stabilization scheme.

Figure 12:
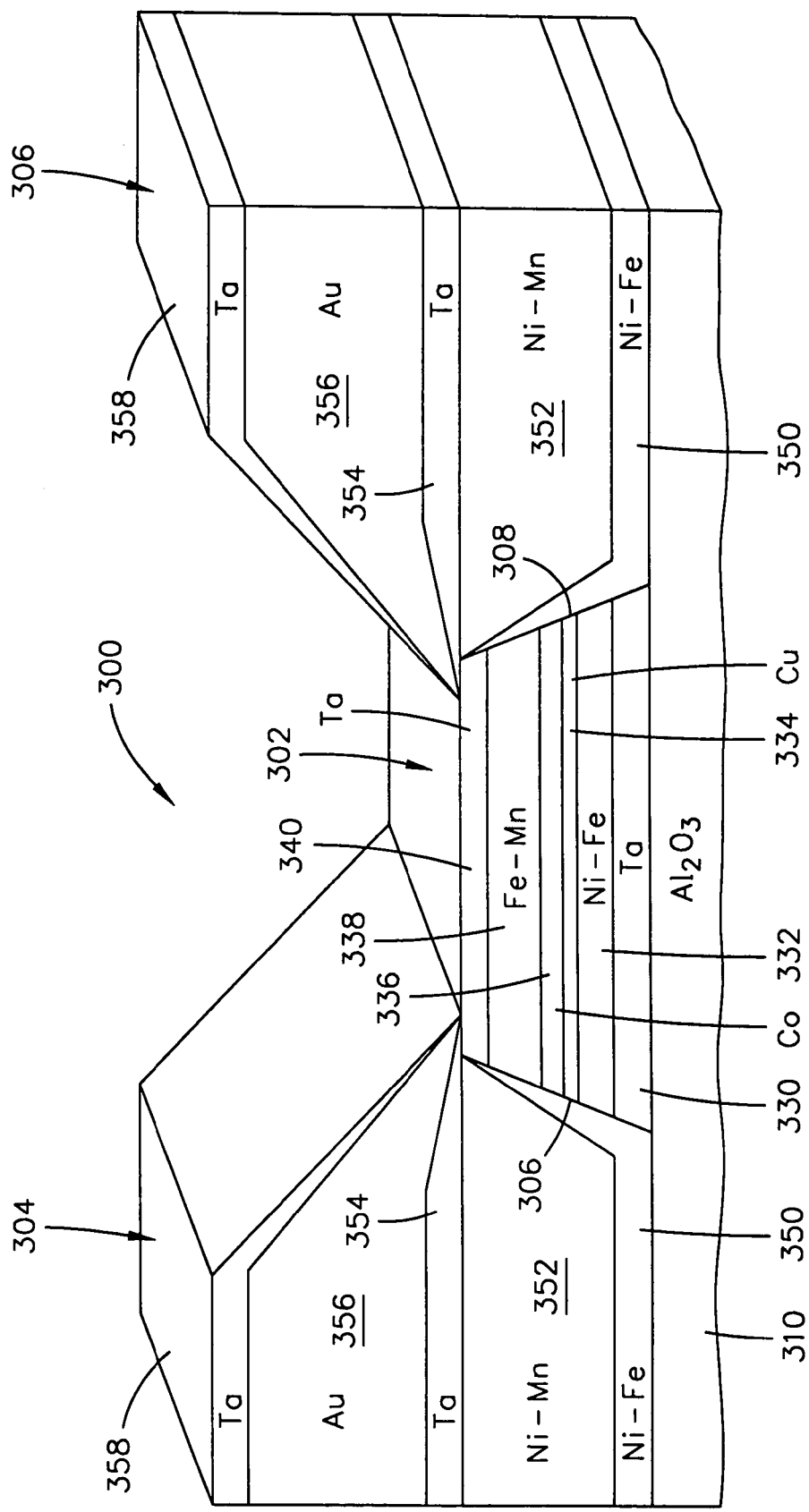
FIG. 12 is another enlarged ABS illustration of the read sensor and first and second lead layers of the read head with an antiferromagnetic stabilization schemes shown in FIG. 9.

FIG. 12 shows another embodiment 300 of a spin valve sensor 302 and first and second lead layers 304 and 306. Each of the leads 304 and 306 comprises multiple films commencing with a ferromagnetic film layer 350, an antiferromagnetic metallic film 352, a non-magnetic adhesion layer 354, an electrically conductive layer 356 and a non-magnetic cap layer 358. Typical materials and thicknesses in nanometers (nm) for the layers 350, 352, 354, 356 and 358 are Ni—Fe(5.6)/Ni—Mn(25)/Ta(5)/Au(40)/Ta(5). The purpose of the electrically conductive layer 356 is to conduct the sense current through the spin valve sensor 302. The purpose of the ferromagnetic film 350 and the antiferromagnetic metallic film 352 is to longitudinally bias the free layer 332.

The magnetic spins of the free layer 332 are in domains which interface one another at domain walls. The orientation of the spins within each domain is different. When the free layer is subjected to magnetic incursions from the rotating disk the domain walls do not return to their same orientation which causes the spins in the domains to be oriented differently. This causes the free layer to exert varying magnetic influences, referred to in the art as Barkhausen noises, on the free layer during its operation which degrades its performance. Accordingly, the free layer must be stabilized to obviate this problem.

Because of the sloping side edges 306 and 308 the edges of the layers 350, 352, 354, 356 and 358 also have sloping edges. The ferromagnetic film 350, which is deposited first, has a tail portion which interfaces the sloping side edges of the layers of the spin valve sensor 202. The antiferromagnetic metallic film 352 exchange couples to the ferromagnetic film 350 so that the magnetic spins in the ferromagnetic film 350 are oriented parallel to the ABS. This causes a magnetostatic coupling between the ferromagnetic film 350 and the free layer 332. The fields from these magnetostatic couplings longitudinally bias the free layer so that the free layer have a single magnetic domain state. This eliminates the multi-domain wall condition which causes Barkhausen noises on the operation of the spin valve sensor. The ferromagnetic and the antiferromagnetic metallic films 350 and 352 must exhibit a high unidirectional anisotropy (Hua) in order to longitudinally bias the free layer of the spin valve sensor.

The thickness of the ferromagnetic films 350 in the end regions is comparable to that of the free layer 332 and the thickness of the antiferromagnetic metallic film 352 is greater than a critical value of 20 nm which is needed for strongest exchange coupling to the ferromagnetic films 350. To attain a high unidirectional anisotropy (Hua), annealing at >=240° C. in a longitudinal field is performed to develop exchange coupling between the films 350 and 352. Additional annealing at >=200° C. in a transverse field is performed later for transversely orienting the magnetic moment of the pinned layer 336 while still maintaining the orientation of the magnetic moment of the ferromagnetic films 350 in the end regions in a longitudinal direction. A step height between the spin valve sensor 302 and each of the first and second lead layers 304 and 306 is 49.6 nm. While the read sensor shown in FIG. 12 has good read sensitivity, the step of 49.6 nm requires a sufficiently thick second gap layer (G2 in FIG. 9) so that pinholes do not develop which can cause shorting of the sense current circuit. It has been found that the magnetic moment required for antiferromagnetic stabilization of the read sensor 302 in FIG. 12 is 0.36 memu/cm$^2$ which obtains good read sensor stability and provides good linear read sensitivity of the head. The longitudinal biasing scheme employed for the embodiment shown in FIG. 12 will be referred to hereinafter as the antiferromagnetic (AFM) stabilization scheme.

Both the HM and AFM stabilization schemes used for the Fe—Mn SV heads are compared in Table 1 herein below.

TABLE 1

Comparison between HM and AFM Stabilization Schemes

| Attributes | HM Stabilization Scheme | AFM Stabilization Scheme |
| --- | --- | --- |
| Step Height (nm) | 33 | 49.6 |
| G2/Al$_2$O$_3$ Step Coverage | Good | Poor |
| Magnetic Moment (memu/cm$^2$) | 0.65 | 0.36 |
| Sensor Stability | Yes | Yes |
| Read Sensitivity | Low | High |
| H$_C$ (Oe) | $\geq$1400 | NA |
| H$_{UA}$ (Oe) | NA | $\geq$140 |
| Side Read Suppression | Yes | Yes |
| Read Efficiency | Low | High |

Figure 13:
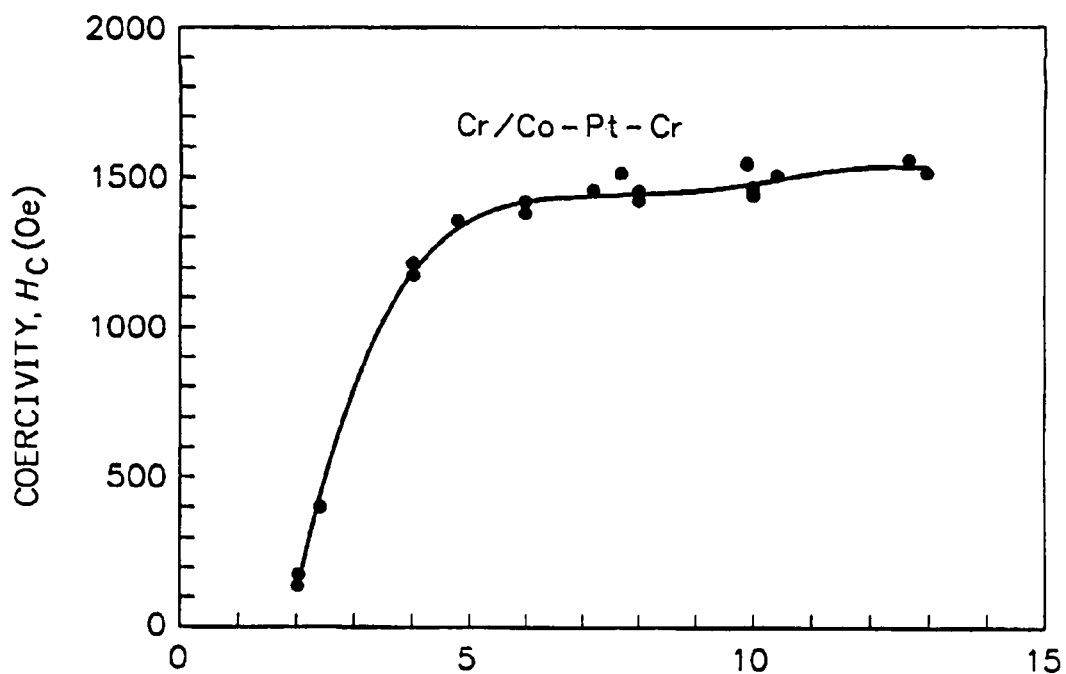
FIG. 13 is a graph of the coercivity ($H_C$) versus film thickness in nanometers of hard-magnetic Co—Pt—Cr films employed in the stabilization scheme of the read head shown in FIG. 11.

Step heights, determined from thickness differences between read and end regions, are 33 and 49.6 nm for the SV heads with HM and AFM stabilization schemes, respectively where the read region is the mean width of the free layer at the ABS and the end region is the remaining width of each lead at the ABS. The existence of the step height in the AFM stabilization scheme (FIG. 12) causes difficulties in the coverage of the top read-gap layer over the SV sensor 302. The second read gap layer (G2) made of Al$_2$O$_3$ can be as thin as 51.8 nm in an Fe—Mn SV head with a 150 nm read gap. The shallower step in the SV head 200 in FIG. 11 with the HM stabilization scheme leads to better step coverage, and thus reduces probability of shorting between the SV sensor 202 and the second shield layer S2 (See FIG. 9). However, the magnetic moment (0.65 memu/cm$^2$) used for the HM stabilization is required to be more than that (0.36 memu/cm$^2$) used for the AFM stabilization to ensure sensor stability. This requirement leads to lower read sensitivity when the HM stabilization scheme is used. For the Cr(S)/Co—Pt—Cr films, the coercivity (H$_C$) increases with the Co—Pt—Cr film thickness (FIG. 13). It reaches 407 and 1194 Oe at 2.4 and 4 nm, respectively. On the other hand, for the Ni—Fe(6)/Ni—Mn films, the unidirectional anisotropic field (H$_{UA}$) appears at 9.3 nm. It reaches 118 Oe and 153 Oe at 16.2 and 20.8 nm, respectively.

With such high values of H$_C$ and H$_{UA}$, the magnetic moment of the free layer at the first and second side edges is very well pinned and thus side reading resulting from magnetization rotation at the side edges is substantially reduced. However, stray fields of the Co—Pt—Cr film reduce read efficiency resulting from difficulties in the rotation of the magnetic moment at edges of the free layer in two sides of the spin valve sensor. In addition, designed thicknesses and magnetic properties in both of the HM and AFM stabilization schemes in fact cannot be attained at the junction between the read and end regions. A longitudinal bias tail is formed at the junction due to shadowing effects of photoresists during depositions. The HM and AFM films in the longitudinal bias tail have thicknesses varying from designed values to 0. These thickness variations lead to varying magnetic properties. Furthermore, the photoresists may contaminate the junction in the head fabrication process, and thus degrade magnetic properties.

The comparison indicates that both the HM and AFM stabilization schemes have their own merits and deficiencies. Currently, the HM stabilization scheme is applied to most practical SV sensors. The use of the HM stabilization scheme for the 5 Gb/in$^2$ SV sensor leads to good read performance, such as quiet GMR (giant magnetoresistive) responses, high read sensitivity and effective side read suppression. To perform magnetic recording beyond 5 Gb/in$^2$, however, the free layer thickness must be reduced, and the HM film thickness must also be correspondingly reduced to attain sensor stability and yet retain high signal sensitivity. An HM film thinner than 2.4 nm, however, exhibits an H$_C\leq$500 Oe (FIG. 13), which is not high enough to pin the magnetic moment of the free layer at side edges. As a result, GMR responses will show hysteretic noises. In addition, stray fields of the HM film cause the two sides of the SV sensor in the read region to be ineffective in reading signals, and the size of this ineffective zone ($\geq$0.1 µm in each side) does not decrease as the submicron width of the sensor further decreases for a higher track density. In contrast, in the AFM stabilization scheme, (FIG. 12) as the Ni—Fe film 350 in the end regions becomes thinner, H$_{UA}$ becomes higher than needed to pin M$_1$ the magnetic moment of the free layer at side edges. The AFM stabilization scheme is thus preferred for magnetic recording beyond 5 Gb/in$^2$. Two issues, however, still remain. One is the coverage of the second read-gap layer (G2) over the steep step, and the other is the absence of exchange coupling at the junction due to insufficient AFM film thickness. These issues can be solved in the SV head proposed in this invention as described below.

THE INVENTION

Figure 15:
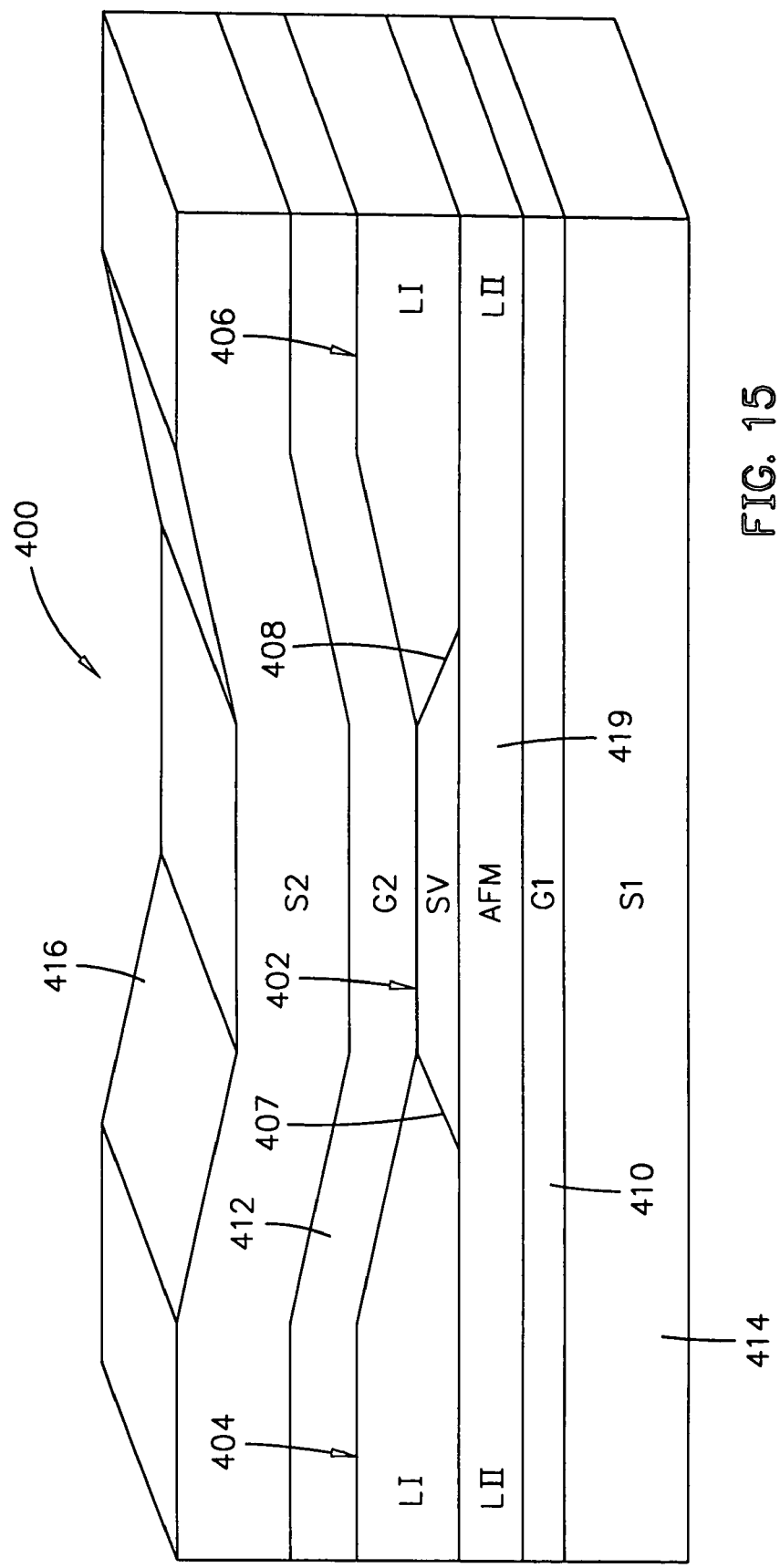
FIG. 15 is an ABS illustration of the present read head.

In FIG. 15 there is shown a first embodiment 400 of the present spin valve read head which includes a spin valve sensor layer 402 and first and second lead layers 404 and 406. The first and second lead layers 404 and 406 are connected to sloping side edges 407 and 408 of the sensor 402, wherein the edges 407 and 408 define the track width of the read head 400. The spin valve sensor layer 402 and the first and second lead layers 404 and 406 are sandwiched between first and second non-magnetic read gap layers (G1 and G2) 410 and 412, and the read gap layers 410 and 412 are sandwiched between first and second ferromagnetic shield layers (S1 and S2) 414 and 416. The embodiment 400 differs from the embodiment 300 in FIG. 12 in that an antiferromagnetic oxide film 419 is sandwiched between an insulation layer 410 on one side and the spin valve sensor 402 and the first and second lead layers 404 and 406 on the other side. The purpose of the antiferromagnetic oxide film 419 will be described in detail hereinafter.

Figure 16A:
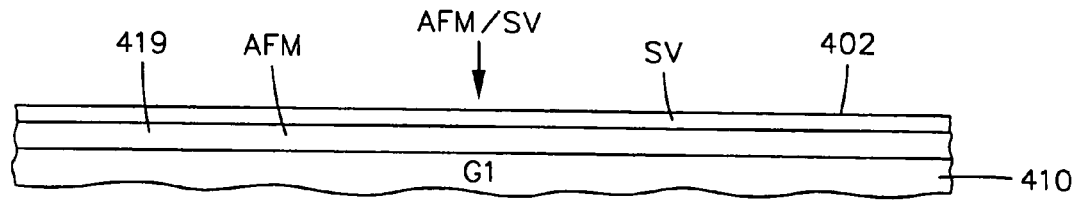
FIGS. 16A–16E are schematic illustrations of various steps in the construction of the read head shown in FIG. 15.
Figure 16B:
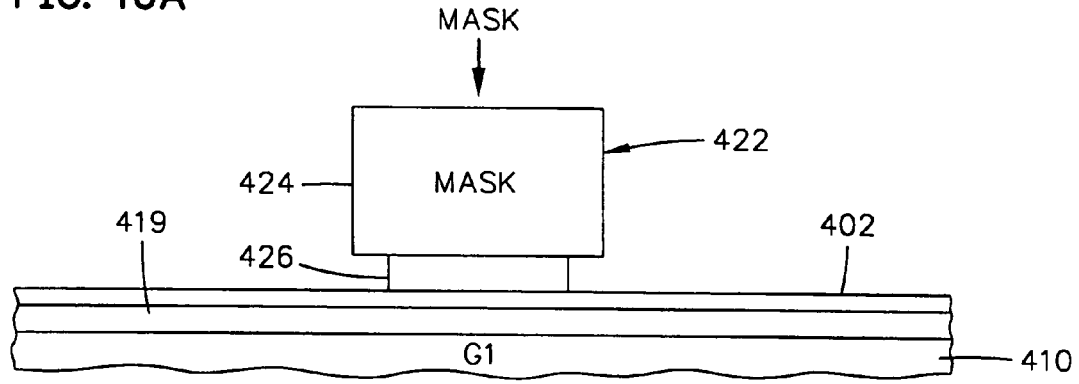
Figure 16C:
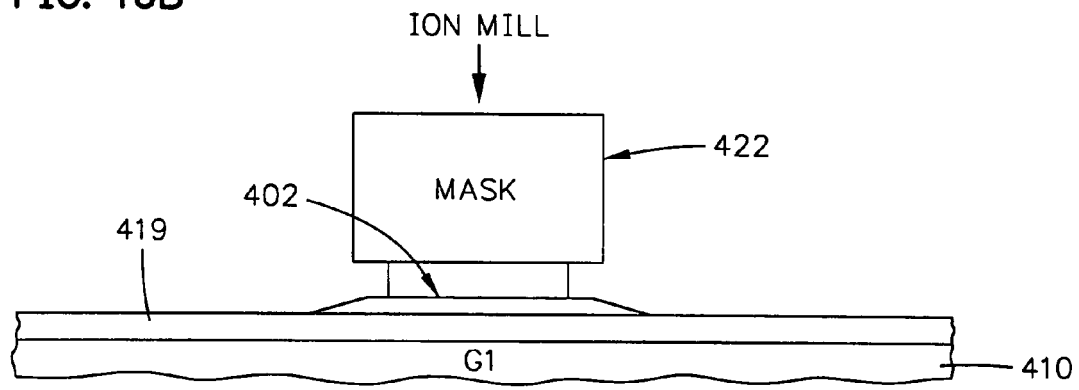
Figure 16D:
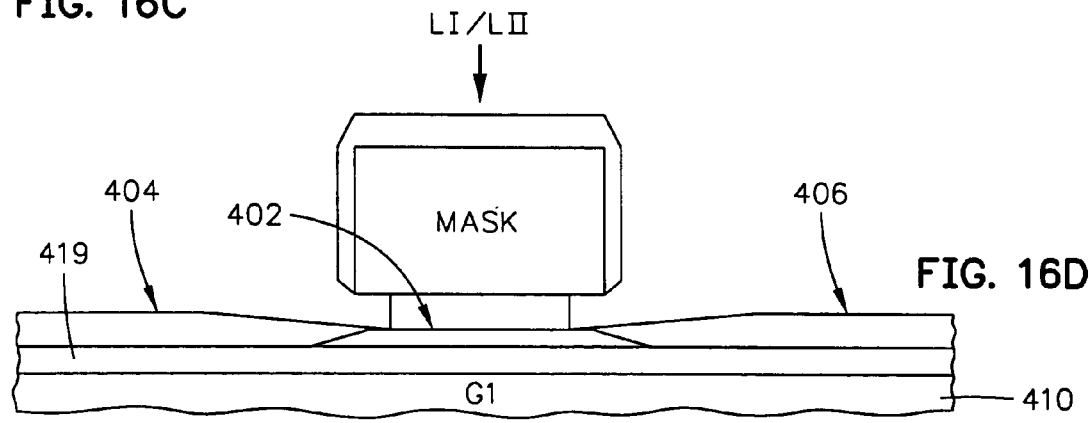

FIGS. 16A–6E illustrate various steps in making the antiferromagnetic oxide film 419, the spin valve sensor 402 and the first and second lead layers 404 and 406. As shown in FIG. 16A, the antiferromagnetic oxide film 419 is deposited on the insulation layer 410, forming a bi-layer first read gap, followed by deposition of the spin valve sensor 402. The antiferromagnetic oxide film 419 and the spin valve sensor 402 are deposited in a field that is oriented perpendicular to the ABS. In FIG. 16B the bi-layer photoresist 422 with top and bottom photoresist layers 424 and 426 are formed on the read sensor 402. In FIG. 16C the wafer is ion milled until the exposed portion of the read sensor is removed exposing portions of the antiferromagnetic oxide film 419. In FIG. 16D the first and second lead layers 404 and 406 are formed and in FIG. 16E the photoresist 422 is removed leaving the first and second lead layers 404 and 406 connected by way of contiguous junctions with the spin valve sensor 402. The first and second lead layers 404 and 406 are deposited in a field that is directed parallel to the ABS.

Figure 17:
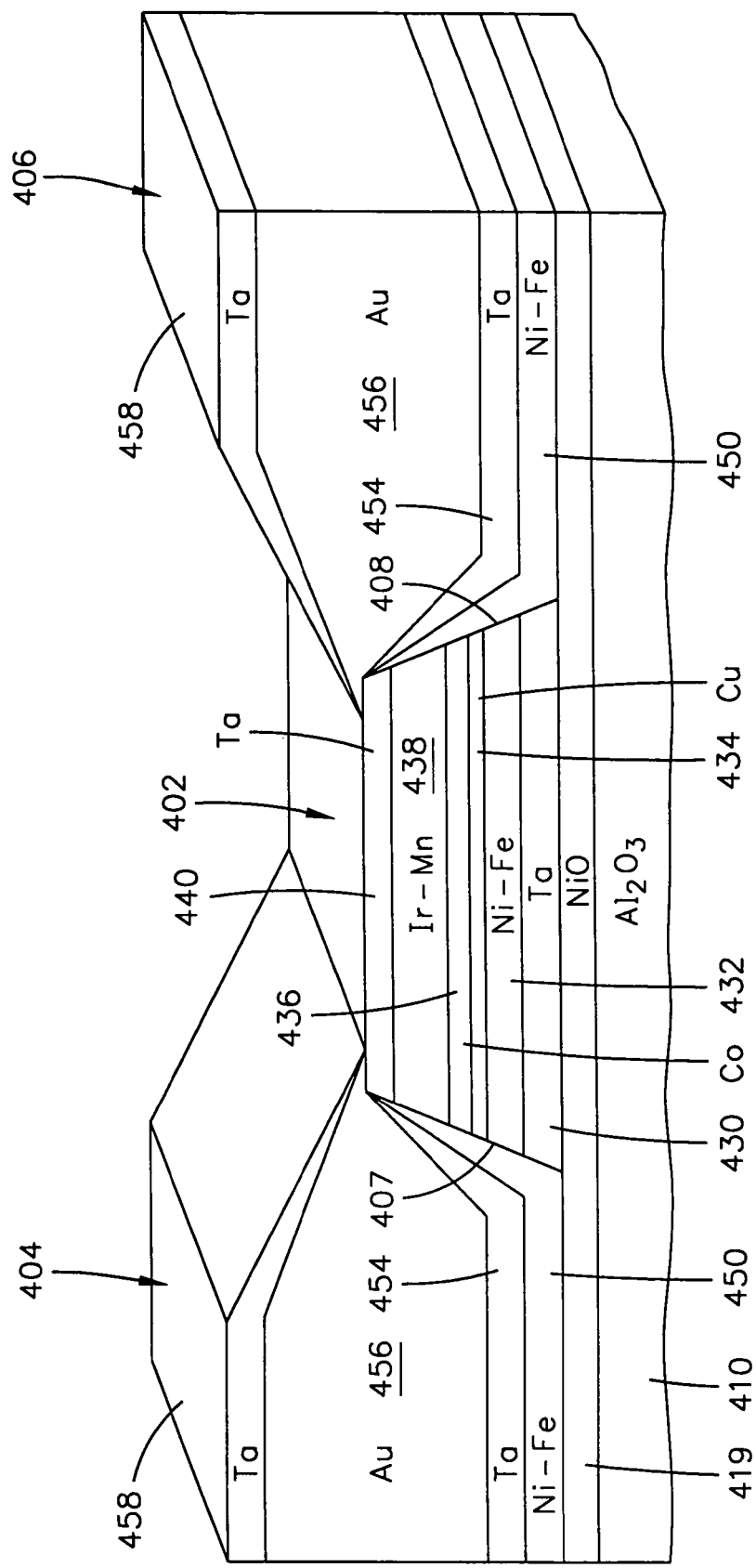
FIG. 17 is an enlarged ABS illustration of the read sensor and first and second lead layers of the read head in FIG. 15 with a first antiferromagnetic stabilization scheme.

FIG. 17 shows an enlargement of the spin valve sensor 402 and the first and second lead layers 404 and 406 showing a first AFM stabilization scheme. The spin valve sensor 402 comprises a non-magnetic seed layer 430, a ferromagnetic free layer 432, a electrically conductive non-magnetic spacer layer 434, a ferromagnetic pinned layer 436, an antiferromagnetic pinning layer 438 and a non-magnetic cap layer 440. Exemplary materials and thicknesses in nanometers (nm) for the films of the spin valve read sensor 402 comprise the seed layer being Ta(5), the free layer 432 being Ni—Fe(5.6), the spacer layer 434 being Cu(2.6), the pinned layer 436 being Co(2.8), the pinning layer being Ir—Mn(10) and the cap layer 440 being Ta(5).

Each of the lead layers 404 and 406 comprises a ferromagnetic film 450, an adhesion layer 454, an electrically conductive layer 456 and a cap layer 458. The ferromagnetic film 450 abuts the sloping side edges 407 and 408 of the spin valve sensor 402 and terminates in a tail due to the shadowing effect of the bi-layer photoresist shown in FIG. 16D. Preferred materials and thicknesses in nanometers for the films of the first and second lead layers are that the ferromagnetic film 450 is Ni—Fe(5.6), the adhesion layer 454 is Ta(5), the electrically conductive layer 456 is Au(40) and the cap layer is Ta(5).

Figure 18:
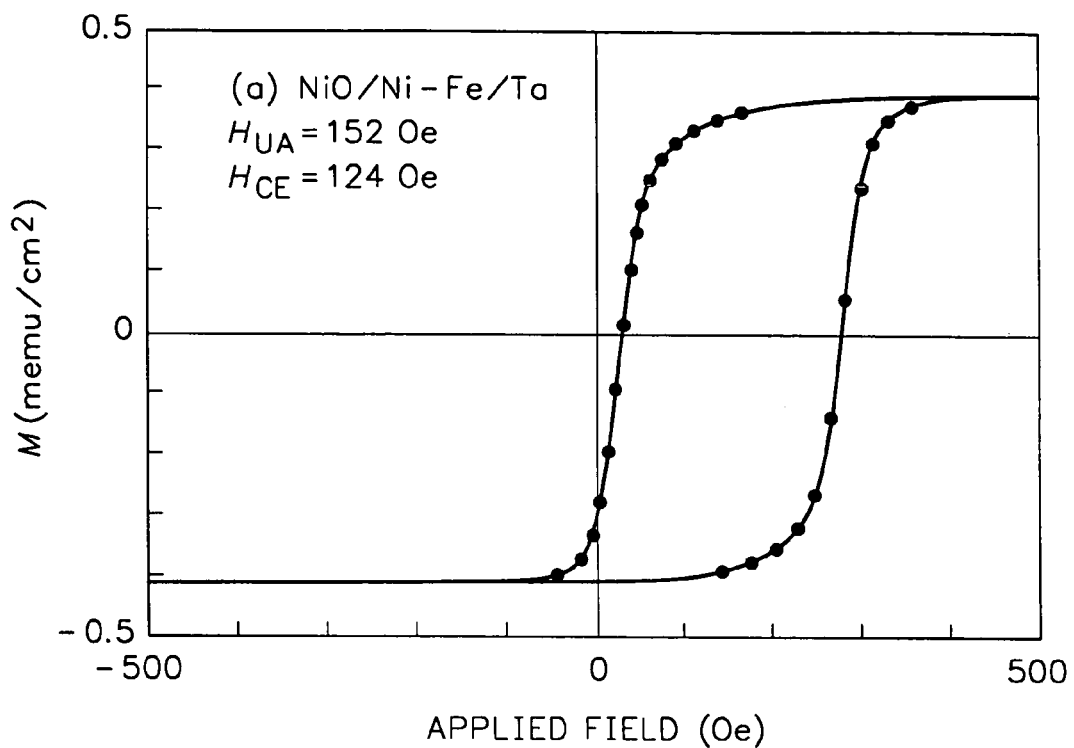
FIG. 18 is a graph of a hysteresis loop showing the unidirectional anisotropic field ($H_{UA}$) and the coercivity ($H_C$) of exchange-coupled NiO(40)/Ni—Fe(6) films employed in the stabilization scheme of the read head shown in FIG. 17.
Figure 19:
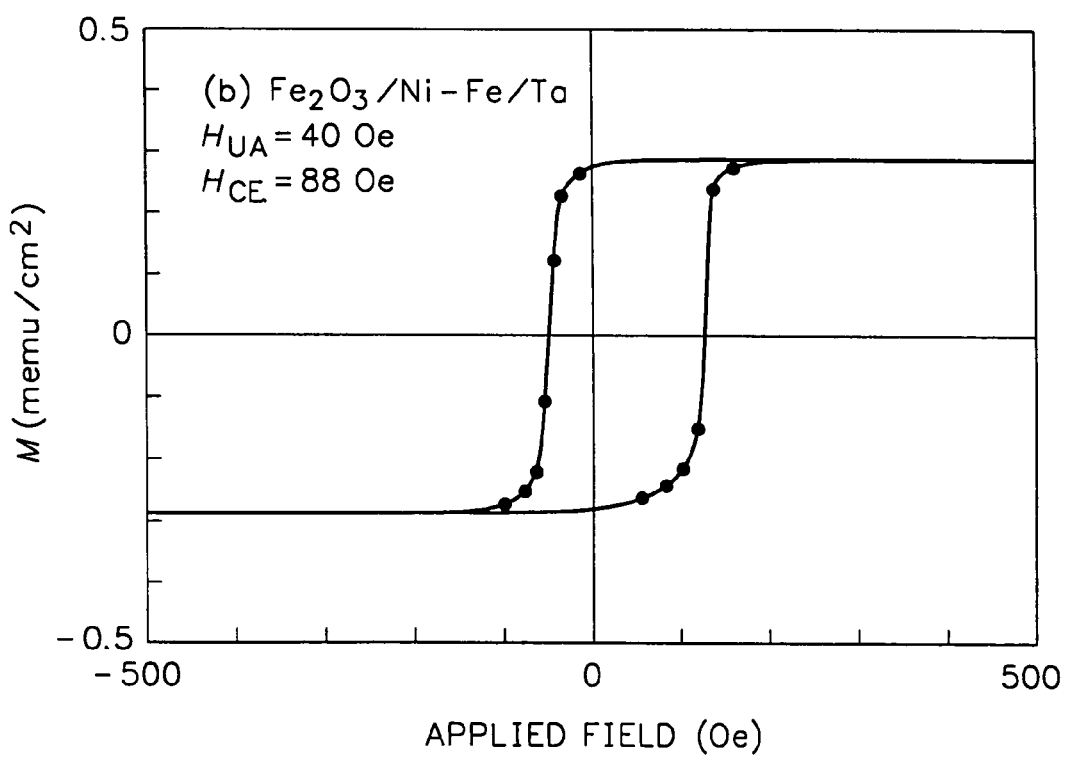
FIG. 19 is a graph of a hysteresis loop showing the unidirectional anisotropic field ($H_{UA}$) and the coercivity ($H_C$) of exchange-coupled $\alpha$-$Fe_2O_3$(60)/Ni—Fe(4.8) films employed in the stabilization scheme of the read head shown in FIG. 17.

The scheme for the free layer 432 comprises the antiferromagnetic oxide film 419 and the stabilization ferromagnetic films 450 which are located in the end regions. The antiferromagnetic oxide film 419 is exchange coupled to the ferromagnetic films 450 in the end regions which causes the ferromagnetic films 450 to have their magnetic moments oriented parallel to the ABS. The antiferromagnetic oxide film 419 is preferably a NiO film with a thickness of 40 nanometers or α-Fe$_2$O$_3$ film with a thickness of 60 nanometers. Exchange coupled NiO(40)/Ni—Fe(6) films exhibit an H$_{UA}$ of 152 Oe (FIG. 18), while exchange coupled α-Fe$_2$O$_3$(60)/Ni—Fe(4.8) films exhibit an H$_{UA}$ of 40 Oe (FIG. 19). An H$_{UA}$ of 40 Oe should be high enough to counteract the coercivity and demagnetizing field of the free layer, thereby stabilizing the free layer through magnetostatic and exchange interactions between read and end regions while remaining magnetically soft for signal readback. More importantly, NiO and α-Fe$_2$O$_3$ film thicknesses remain identical and beyond their critical thicknesses (35 and 50 nm, respectively) over the entire first and second end regions, so that there are no unpinned regions at the first and second sensor sides as those existing in the spin valve sensors with hard-magnetic and antiferromagnetic stabilization schemes. It should be noted that the antiferromagnetic oxide film 419 does not exchange coupled to the free layer 432 since these layers are separated by a non-magnetic bottom seed layer 430. It should be further noted that the antiferromagnetic oxide film 419 thickens the bottom read gap thereby reducing probability of shorting between the bottom shield layer 414 (FIG. 15) and the spin valve sensor 402. The bottom read gap layer 410 may be a bi-layer of aluminum oxide (Al$_2$O$_3$) 410 with a thickness of 27.2 nanometers and the antiferromagnetic NiO film with a thickness of 40 nanometers and second read gap layer 412 may be aluminum oxide (Al$_2$O$_3$) 412 with a thickness of 51.8 nanometers. The step height between the spin valve sensor 402 and the first and second lead layers 404 and 406 with the thicknesses of the various films set forth hereinabove is 24.6 nanometers which is small enough for good coverage of the second read gap layer 412.

Figure 20:
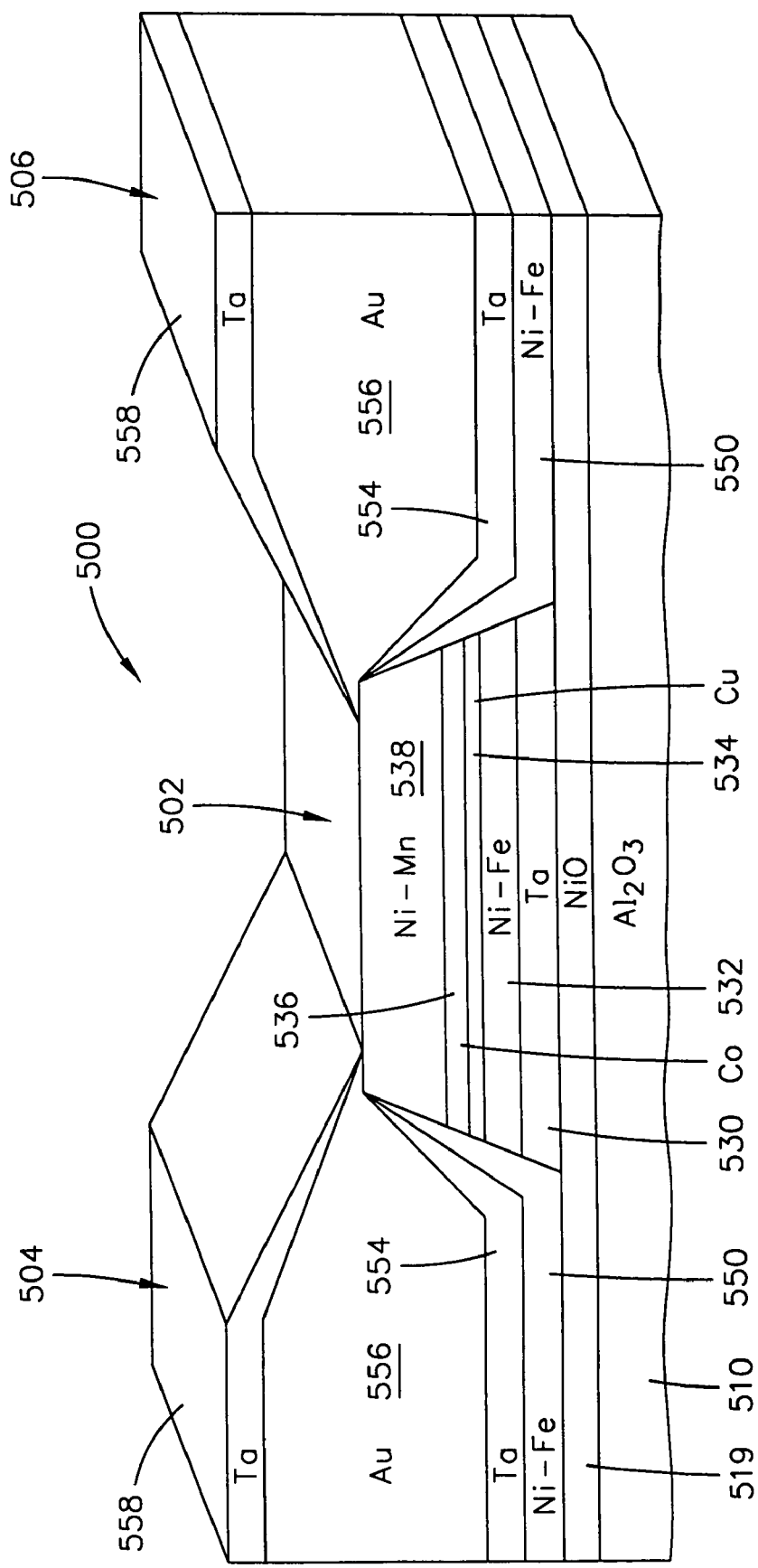
FIG. 20 is an enlarged ABS illustration of the read sensor and first and second lead layers of the read head in FIG. 15 with a second antiferromagnetic stabilization scheme.

Another embodiment 500 of the spin valve sensor 502 and the first and second lead layers 504 and 506 is illustrated in FIG. 20. The spin valve sensor 502 may comprise a non-magnetic seed layer 530 of Ta(5), a ferromagnetic free layer 532 of Ni—Fe(5.6), a electrically conductive non-magnetic layer 534 of Cu(2.6), a ferromagnetic pinned layer 536 of Co(2.8), an antiferromagnetic metallic film 538 of Ni—Mn (25) and a cap layer 538 of Ta(5). Each of the first and second lead layers 504 and 506 may comprise a ferromagnetic film 550 of Ni—Fe(5.6), a non-magnetic adhesion layer 554 of Ta(5), an electrically conductive layer 556 of Au(40) and a non-magnetic cap layer 558 of Ta(5). The antiferromagnetic oxide film 519 is preferably nickel oxide (NiO) with a thickness of 40 nanometers. The antiferromagnetic oxide film 519 exchange couples to the ferromagnetic films 550 in the end regions and the ferromagnetic films 550 magnetostatically coupled to the spin valve read sensor 502 for stabilizing the free layer 532. It should be noted that the antiferromagnetic oxide film 519 does not exchange couple to the free layer 532 because of the separation by the non-magnetic seed layer 530. With these thicknesses the step height between the first and second lead layers 504 and 506 and the spin valve sensor layer 502 is 9.6 nanometers which is small enough for good coverage of the second read gap layer 412 (see FIG. 15) when the read gap layer is made of aluminum oxide (Al$_2$O$_3$) with a thickness of 36.8 nanometers.

Figure 16E:
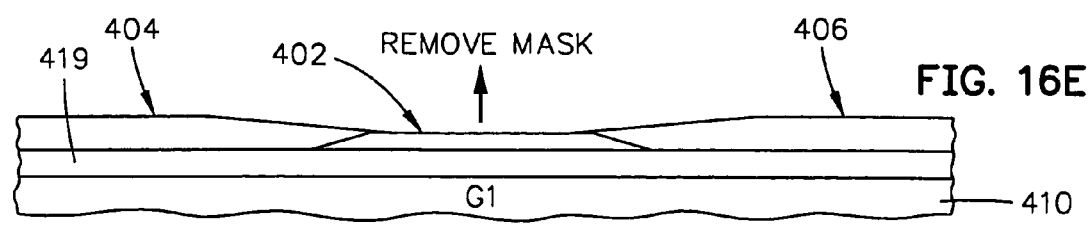

As shown in FIG. 16A, the antiferromagnetic oxide film 419 is deposited on an insulation layer 410, forming a bi-layer first read gap, followed by the deposition of the spin valve sensor 402. The antiferromagnetic oxide film 419 and the spin valve sensor 402 are deposited in a field that is oriented to the ABS. After the depositions, bi-layer photoresist 422, shown in FIG. 16B, is employed and ion milling is implemented to remove read sensor material down to the antiferromagnetic oxide film 419, thereby defining the side edges and track width of the partially completed read head. The first and second lead layers 404 and 406 are then deposited with the top cap layers 458 in FIG. 20 having a thickness of 15 nanometers. The films of the first and second leads 404 and 406 are deposited on top of the antiferromagnetic oxide film 419 in the end regions in a field which is directed parallel to the ABS. Next, the bi-layer photoresist 422 is removed as shown in FIG. 16E.

Figure 14:
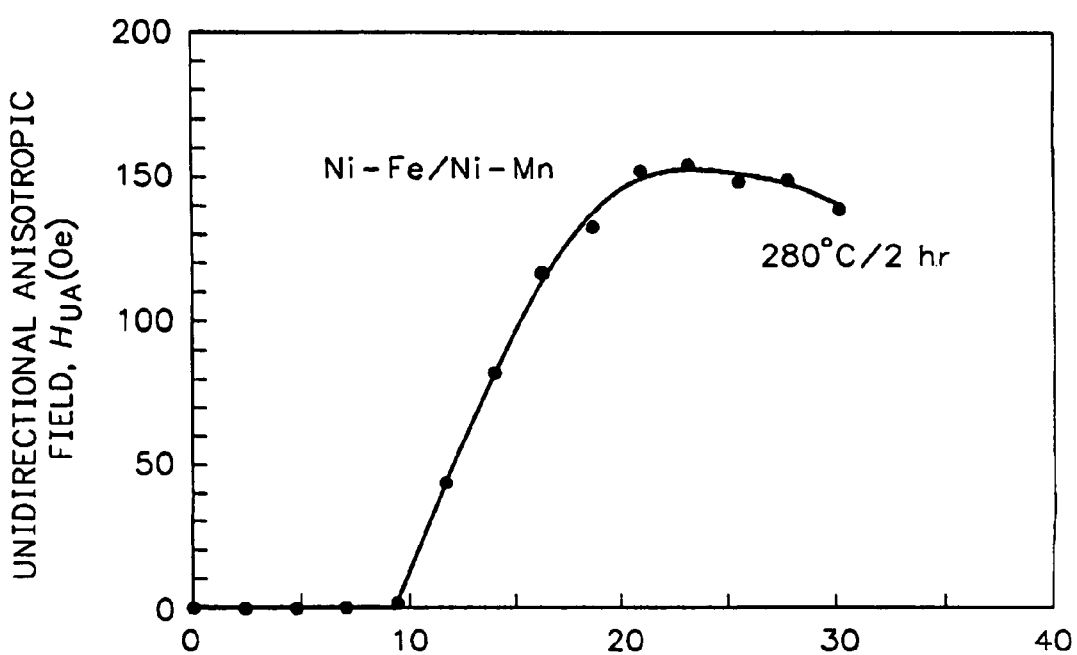
FIG. 14 is a graph of the unidirectional anisotropic field ($H_{UA}$) versus film thickness in nanometers of antiferromagnetic Ni—Mn films deposited on ferromagnetic Ni—Fe(6) films employed in the stabilization scheme of the read head shown in FIG. 12.
Figure 21:
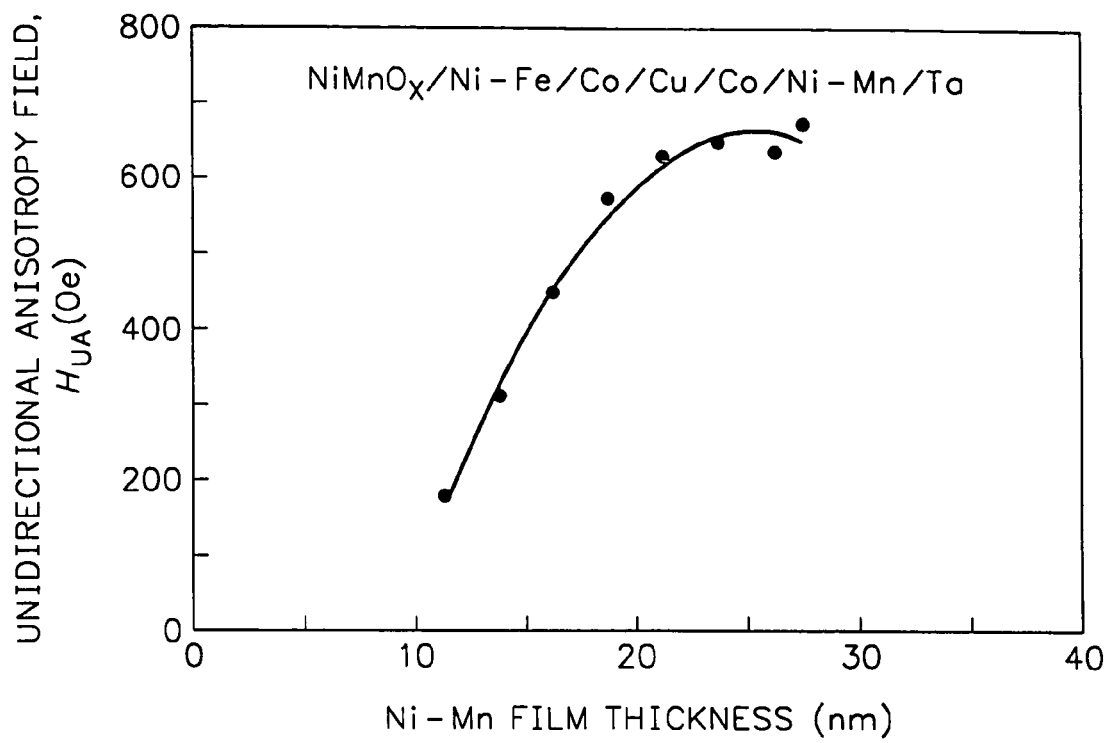
FIG. 21 is a graph of the unidirectional anisotropic field ($H_{UA}$) versus Ni—Mn film thickness for the pin valve sensor comprising Ni—$MnO_x$(5)/Ni—Fe(5)/Co(0.4)/Cu(2.8)/Co(2.8)/Ni—Mn films wherein the Ni—Mn film thickness is reduced by ion milling.
Figure 22:
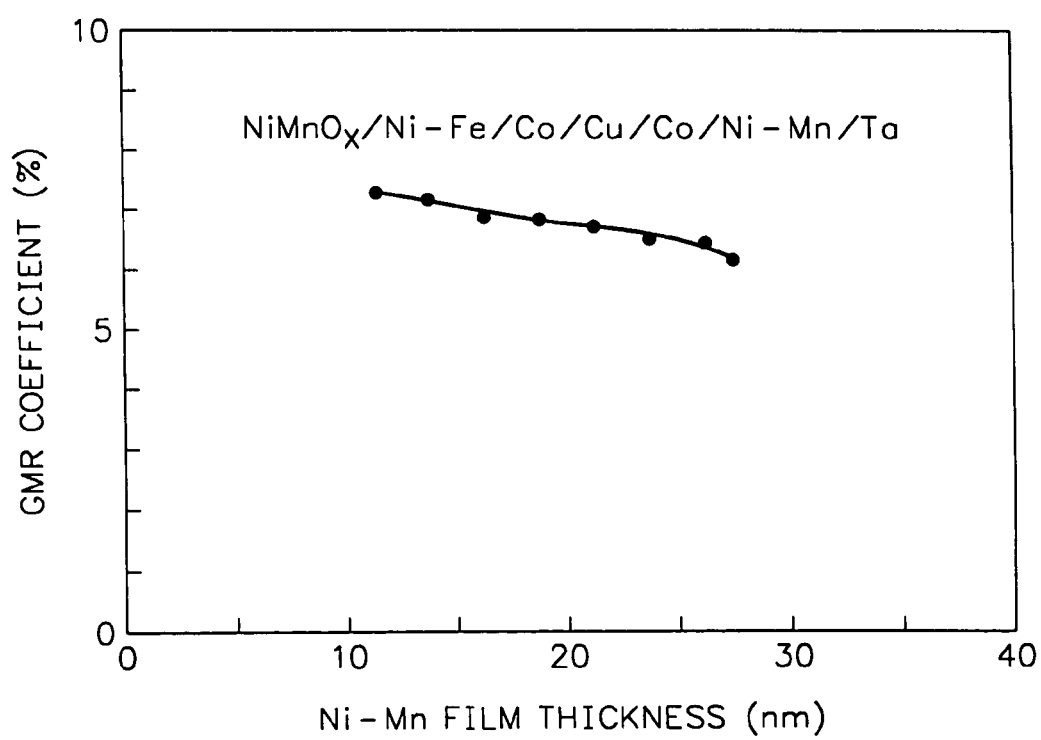
FIG. 22 is a graph of the GMR coefficient versus Ni—Mn film thickness for the spin-valve sensor comprising Ni—MnO$_X$(5)/Ni—Fe(4.5)/Co(0.6)/Cu(2.8)/Co(2.8)/Ni—Mn films wherein the Ni—Mn film thickness is reduced by ion milling.

In order to obtain an antiferromagnetic metallic film of Ni—Mn of 15 nanometers shown at 538 in FIG. 20 it is necessary to employ a method of construction which is part of the present invention. A critical thickness of the Ni—Mn antiferromagnetic metallic film 538 is ~25 nanometers at which the strongest exchange coupling occurs between the Ni—Mn film and the pinned layer 536. However, with proper annealing and ion milling the thickness of the antiferromagnetic metallic Ni—Mn film 538 may be reduced from 25 nanometers to 15 nanometers, while maintaining strong exchange coupling and improving the GMR coefficient. FIGS. 21 and 22 show HUA and the GMR coefficient, respectively, versus the Ni—Mn film thickness for the spin valve sensor comprising Ni—MnO$_x$(5)/Ni—Fe(5)/Co(0.4)/Cu(2.8)/Co(2.8)/Ni—Mn Films. The spin valve sensor is annealed for 2 hours at 280° C. and partially ion-milled to remove the Ta cap layer and reduce the Ni—Mn film thickness. As the Ni—Mn film thickness decreases from 25 to 15 nm, H$_{UA}$ decreases from 664 to 379 Oe (FIG. 21), while the GMR coefficient increases from 6.3% to 7.2%. The H$_{UA}$ of 379 Oe will remain nearly unchanged at a drive operation temperature (120° C.) and this value is still much higher than that needed (~200 Oe) for a proper sensor operation. It should be noted that in this exemplary spin valve sensor, a non-magnetic, insulating Ni—MnO$_X$ seed layer is used to replace the non-magnetic, metallic Ta seed layer for improving the thermal stability, and a Co nanolayer is inserted between the Ni—Fe free layer and the Cu spacer layer for improving the GMR coefficient. It should be further noted that after the same type of annealing, the H$_{UA}$ of the Co(2.8)/Ni—Mn(2.5) films (FIG. 21) used in the read region is much higher than that of the Ni—Fe(6)/Ni—Mn(2.5) films (FIG. 14) used in the end regions. This H$_{UA}$ improvement mainly originates from the replacement of the Ni—Fe film with the Co film having a magnetic moment identical to that of the Ni—Fe film, and from the replacement of the underlying Al$_2$O$_3$ film with Ni—MnO$_x$Ni—Fe/Co/Cu films having a strong crystalline texture. In addition, the ion milling also reduces the cap layers 558 of the first and second leads in FIG. 20 from 15 nanometers to 5 nanometers in the end regions.

In addition to the antiferromagnetic Ir—Mn and Ni—Mn materials used as the pinning layers 438 or 538, other suitable materials are Rh—Mn, Pt—Mn, Pd—Pt—Mn and Cr—Pt—Mn films. In addition to the antiferromagnetic NiO material used for the sensor stabilization 519 an antiferromagnetic α-Fe$_2$O$_3$ material can be employed. It should be understood that in all of the embodiments that the read head is completed by forming the second read gap layer and second shield layer followed by construction of a write head which, as shown in FIG. 6, includes first and second pole piece layers 92 and 94, a write gap layer 102, an insulation stack which comprises first, second and third insulation layers 86, 88 and 90 with at least one coil layer 84 embedded therein. It is desirable that the construction of the read head involve heat treatments that are equal to or less than 200° C. in a field that is oriented parallel to the ABS. Such heat treatments create a negligible perturbation of only about 1° in the orientation of the magnetic moment of the free layer 432 or 532 shown in FIGS. 17 and 20. Further, it is to be understood that the materials and thickness described hereinabove are exemplary and can vary depending upon desired results.

Clearly, other embodiments and modifications of this invention will occur readily to those of ordinary skill in the art in view of these teachings. Therefore, this invention is to be limited by the following claims, which include all such embodiments and modifications when viewed in conjunction with the above specification and accompanying drawings.

We claimed:

1. method of making a merged magnetic head that has a read head and a write head wherein each head forms a portion of an air bearing surface (ABS) and the read head has a read region that has first and second sides that extend substantially perpendicular to the ABS, first and second end regions that are adjacent the first and second sides respectively and the read region and first and second end regions being adjacent the ABS, comprising:

making the read head as follows:
    forming a multi-layered read sensor in the read region with first and second side edges that define said first and second sides of the read region, and with one of the multi-layered read sensor's layers being a non-magnetic layer;
    forming first and second lead layers in the first and second end regions with each lead layer having a first side edge wherein the first side edge of the first lead layer is adjacent the first side edge of the read sensor and the first side edge of the second lead layer is adjacent the second side edge of the read sensor;
    forming first and second insulation gap layers with the multi-layered read sensor and the first and second lead layers located therebetween so that each insulation gap layer is located in each of the read and first and second end regions;
    forming the read sensor and the first and second insulation gap layers between the first and second shield layers; and
    forming an antiferromagnetic oxide film between the first insulation gap layer film and the first lead layer in the first end region, between the first insulation gap layer and the read sensor in the read region and between the first insulation gap layer and the second lead layer in the second end region with the first and second lead layers exchange coupling to the antiferromagnetic oxide film and magnetostatically coupling to the first and second side edges respectively of the read sensor; and
    the forming of the multi-layered read sensor including a step of forming the non-magnetic layer directly on the antiferromagnetic oxide film;
  making the write head as follows:
    employing the second shield layer as a first pole piece layer;
    forming a second pole piece layer;
    forming a write gap layer that separates the first and second pole pieces at the ABS;
    connecting the first and second pole piece layers at a back gap;

forming an insulation stack with at least one coil layer embedded therein between the first and second pole piece layers and between the ABS and said back gap.

2. The method as claimed in claim 1 comprising:
making a read head as follows:
forming a ferromagnetic free layer and a ferromagnetic pinned layer;
forming an electrically conductive non-magnetic spacer layer between the free and pinned layers;
forming an antiferromagnetic metallic layer that exchange couples to the pinned layer; and
forming a cap layer;
forming each of the first and second lead layers with a ferromagnetic film so that the ferromagnetic film of each of the first and second lead layers exchange couples to the antiferromagnetic oxide film in the first and second end regions respectively and magnetostatically couples to the first and second side edges respectively of the read sensor;
forming non-magnetic adhesion and cap films;
forming an electrically conductive non-magnetic film between the non-magnetic adhesion and cap films; and
in each of the first and second lead layers, forming the ferromagnetic film between the non-magnetic adhesion film and the antiferromagnetic oxide film.

3. The method as claimed in claim 2 wherein the antiferromagnetic oxide film is selected from the group of NiO and $\alpha\text{-}Fe_2O_3$.

4. The method as claimed in claim 3 wherein the antiferromagnetic metallic layer is selected from the group of Ir—Mn, Ni—Mn, Rh—Mn, Pt—Mn, Pd—Pt—Mn and Cr—Pt—Mn.

5. The method as claimed in claim 2 wherein:
the second gap layer interfacially engages the antiferromagnetic metallic layer; and
the antiferromagnetic metallic layer is Ni—Mn.

6. The method as claimed in claim 5 wherein:
a thickness of the antiferromagnetic metallic layer is 15–25 nm; and
the antiferromagnetic oxide film is NiO and the ferromagnetic film of each of the first and second lead layers is Ni—Fe.

7. A method of making a merged magnetic read head and a write head wherein each head has a head surface for facing a magnetic medium, comprising the steps of:
making the read head comprising the steps of:
forming a ferromagnetic first shield layer;
forming a first read gap layer on the first shield layer comprising the steps of:
forming an insulation film on the first shield layer; and
forming an antiferromagnetic oxide film on the insulation film;
forming a read sensor on the first read gap layer with first and second side edges that intersect the head surface comprising the steps of:
forming a ferromagnetic free layer and a ferromagnetic pinned layer;
forming an electrically conductive non-magnetic spacer layer between the free and pinned layers;
forming an antiferromagnetic metallic layer that exchange couples to the pinned layer; and
forming a cap layer on the antiferromagnetic metallic layer;
forming first and second lead layers interfacing the first and second side edges respectively of the sensor;
forming a second read gap layer on the sensor and the first and second lead layers;
forming a ferromagnetic second shield layer on the second read gap layer;
forming each of the first and second lead layers with a ferromagnetic film so that the ferromagnetic film of each of the first and second lead layers exchange couples to the antiferromagnetic oxide film and magnetostatically couples to the read sensor;
making the write head as follows:
employing the second shield layer as a first pole piece layer;
forming a second pole piece layer;
forming a write gap layer that separates the first and second pole pieces at the ABS;
connecting the first and second pole piece layers at a back gap;
forming an insulation stack with at least one coil layer embedded therein between the first and second pole piece layers and between the ABS and said back gap.

8. The method as claimed in claim 7 wherein the making of each lead layer includes:
forming non-magnetic adhesion and cap films;
forming an electrically conductive non-magnetic film between the non-magnetic adhesion and cap films; and
in each of the first and second lead layers, forming the ferromagnetic film between the non-magnetic adhesion film and the antiferromagnetic oxide film.

9. The method as claimed in claim 8 wherein the antiferromagnetic metallic layer is selected from the group of Ir—Mn, Ni—Mn, Rh—Mn, Pt—Mn, Pd—Pt—Mn and Cr—Pt—Mn.

10. The method as claimed in claim 8 wherein the antiferromagnetic oxide film is selected from the group of NiO and $\alpha\text{-}Fe_2O_3$.

11. The method as claimed in claim 10 wherein the antiferromagnetic metallic layer is selected from the group of Ir—Mn, Ni—Mn, Rh—Mn, Pt—Mn, Pd—Pt—Mn and Cr—Pt—Mn.

12. The method as claimed in claim 8 wherein the free layer is Ni—Fe, the spacer layer is Cu, the pinned layer is Co and the antiferromagnetic metallic layer is Ni—Mn.

13. The method as claimed in claim 8 wherein the antiferromagnetic oxide film is NiO and the ferromagnetic film of each of the first and second lead layers is Ni—Fe.

14. The method as claimed in claim 13 wherein the antiferromagnetic metallic layer is Ni—Mn.

15. The method as claimed in claim 14 wherein a thickness of the metallic antiferromagnetic layer is 15 –25 nm.

* * * * *